(12) United States Patent
Hayasaka et al.

(10) Patent No.: US 7,896,967 B2
(45) Date of Patent: Mar. 1, 2011

(54) GAS SUPPLY SYSTEM, SUBSTRATE PROCESSING APPARATUS AND GAS SUPPLY METHOD

(75) Inventors: Shinichiro Hayasaka, Miyagi-gun (JP); Ken Horiuchi, Nirasaki (JP); Fumiko Yagi, Miyagi-gun (JP); Takeshi Yokouchi, Miyagi-gun (JP)

(73) Assignee: Tokyo Electron Limited, Tokyo (JP)

( * ) Notice: Subject to any disclaimer, the term of this patent is extended or adjusted under 35 U.S.C. 154(b) by 186 days.

(21) Appl. No.: 11/671,115

(22) Filed: Feb. 5, 2007

(65) Prior Publication Data
US 2007/0181255 A1 Aug. 9, 2007

Related U.S. Application Data

(60) Provisional application No. 60/773,650, filed on Feb. 16, 2006.

(30) Foreign Application Priority Data
Feb. 6, 2006 (JP) ................................. 2006-028566

(51) Int. Cl.
*C23C 16/52* (2006.01)
*H01L 21/306* (2006.01)

(52) U.S. Cl. .... 118/715; 118/696; 118/708; 156/345.26; 700/121

(58) Field of Classification Search .................. 118/696, 118/708, 715; 156/345.26; 700/121
See application file for complete search history.

(56) References Cited

U.S. PATENT DOCUMENTS

| 5,496,408 | A | * | 3/1996 | Motoda et al. ................. 118/715 |
| 5,958,140 | A | | 9/1999 | Arami et al. |
| 6,162,488 | A | * | 12/2000 | Gevelber et al. .................. 427/8 |
| 7,155,319 | B2 | * | 12/2006 | Nangoy et al. ................. 700/281 |
| 7,371,332 | B2 | * | 5/2008 | Larson et al. .................... 216/58 |
| 2004/0050325 | A1 | * | 3/2004 | Samoilov et al. ............. 118/715 |
| 2005/0005994 | A1 | * | 1/2005 | Sugiyama et al. ................ 141/4 |

FOREIGN PATENT DOCUMENTS

JP 8-158072 6/1996
WO WO2004109420 A1 * 12/2004

* cited by examiner

*Primary Examiner* — Ram N Kackar
*Assistant Examiner* — Satish Chandra
(74) *Attorney, Agent, or Firm* — Oblon, Spivak, McClelland, Maier & Neustadt, L.L.P.

(57) ABSTRACT

A gas supply system for supplying a gas into a processing chamber for processing a substrate to be processed includes: a processing gas supply unit; a processing gas supply line; a first and a second branch line; a branch flow control unit; an additional gas supply unit; an additional gas supply line; and a control unit. The control unit performs, before processing the substrate to be processed, a processing gas supply control and an additional gas supply control by using the processing gas supply unit and the additional gas supply unit, respectively, wherein the additional gas supply control includes a control that supplies the additional gas at an initial flow rate greater than a set flow rate and then at the set flow rate after a lapse of a period of time.

5 Claims, 13 Drawing Sheets

FIG. 9

| GAS SUPPLY PROCESS DATA | | | |
|---|---|---|---|
| PROCESSING GAS | SET FLOW RATE OF PROCESSING GAS LINE 1 | | fm(1) |
| | SET FLOW RATE OF PROCESSING GAS LINE 2 | | fm(2) |
| | SET FLOW RATE OF PROCESSING GAS LINE 3 | | fm(3) |
| | TOTAL SET FLOW RATE OF PROCESSING GAS | | fm |
| | FLOW RATE RATIO BETWEEN FIRST AND SECOND PROCESSING GAS | | C:E |
| ADDITIONAL GAS | SET FLOW RATE OF ADDITIONAL GAS LINE | | fa |
| | INITIAL FLOW RATE | | Fa |
| | INITIAL TIME | | T |

START INITIAL FLOW RATE DETERMINING PROCESS

S110 — CALCULATE FLOW RATE fe OF SECOND PROCESSING GAS

S120 — OBTAIN SET FLOW RATE fa OF ADDITIONAL GAS

S130 — DETERMINE TOTAL FLOW RATE Fe(=fe+fa) OF GASES FLOWING IN SECOND BRANCH LINE

S140 — DETERMINE INNER PRESSURE Pe OF SECOND BRANCH LINE

S150 — DETERMINE AND STORE INITIAL FLOW RATE Fa OF ADDITIONAL GAS

END

FIG. 15

| GAS SUPPLY PROCESS DATA | | |
|---|---|---|
| PROCESSING GAS | SET FLOW RATE OF PROCESSING GAS LINE 1 | fm(1) |
| | SET FLOW RATE OF PROCESSING GAS LINE 2 | fm(2) |
| | SET FLOW RATE OF PROCESSING GAS LINE 3 | fm(3) |
| | TOTAL SET FLOW RATE OF PROCESSING GAS | fm |
| | FLOW RATE RATIO BETWEEN FIRST AND SECOND PROCESSING GAS | C:E |
| ADDITIONAL GAS | SET FLOW RATE OF ADDITIONAL GAS LINE 1 | fa(1) |
| | SET FLOW RATE OF ADDITIONAL GAS LINE 2 | fa(2) |
| | TOTAL SET FLOW RATE OF ADDITIONAL GASES | fa |
| | INITIAL FLOW RATE OF ADDITIONAL GAS LINE 1 | Fa(1) |
| | INITIAL FLOW RATE OF ADDITIONAL GAS LINE 2 | Fa(2) |
| | TOTAL INITIAL FLOW RATE | Fa |
| | INITIAL TIME | T |

352

GAS SUPPLY SYSTEM, SUBSTRATE PROCESSING APPARATUS AND GAS SUPPLY METHOD

FIELD OF THE INVENTION

The present invention relates to a gas supply system for supplying a gas into a processing chamber, a substrate processing apparatus and a gas supply method.

BACKGROUND OF THE INVENTION

A substrate processing apparatus is configured to perform specific processes such as a film forming process, an etching process and the like on a substrate to be processed (hereinafter, simply referred to as "substrate") such as a semiconductor wafer, a liquid crystal substrate or the like.

As for such a substrate processing apparatus, there has been known a plasma processing apparatus, for example. The plasma processing apparatus includes, inside a processing chamber, a lower electrode serving also as a mounting table for mounting thereon a substrate and an upper electrode serving also as a shower head for injecting a gas toward the substrate. Such a parallel plate type plasma processing apparatus is configured to perform specific processes such as a film forming process, an etching process and the like with the use of a plasma generated by applying a high frequency power between both electrodes while supplying a specific gas through the shower head onto the substrate in the processing chamber.

In performing on the substrate specific processes such as a film forming process, an etching process and the like, there has been demanded to improve in-surface uniformity in processing the substrate by making processing characteristics (e.g., an etching rate, an etching selectivity, a film forming rate and the like) uniform in a surface of the substrate.

In such a view, in Japanese Patent Laid-open Application Nos. H8-158072 and H9-45624, there have been proposed techniques for supplying a processing gas of optional composition at an optional flow rate to plural portions on a substrate surface via gas supply lines individually connected with a plurality of gas chambers formed by dividing the inside of the shower head. In accordance with such techniques, the in-surface uniformity in etching the substrate can be improved by locally adjusting a gas concentration on the substrate surface.

A gas used for an actual substrate processing is obtained by mixing plural types of gases, e.g., a processing gas directly participating in a substrate processing, a gas for controlling a deposition of reaction products generated in the substrate processing, a carrier gas such as an inactive gas or the like, and the like. The types of gases are appropriately selected depending on target materials on the substrate or processing conditions. Therefore, there arises a need to perform a flow rate control by using a mass flow controller provided on each of the gas supply lines respectively connected with the gas chambers in the shower head, as disclosed in Japanese Patent Laid-open Application No. H9-45624.

However, in such a conventional configuration, although the gases supplied to plural portions on a substrate surface include common gases, each of the gases supplied from the gas chambers has its own gas supply system and, also, flow rates thereof are individually controlled. Accordingly, a line configuration and a flow rate control in each of the lines become complicated, which results in requiring a large space for the lines and an increased burden of control.

Moreover, an additional gas supply system may be provided in addition to the aforementioned gas supply system to thereby adjust components of the gases supplied to the gas chambers of the processing chamber by adding an additional gas, which is supplied at a preset flow rate from the additional gas supply system, to the gases from the gas supply system. However, when the additional gas is supplied at a very small flow rate (e.g., a few sccm), an inner pressure of a line of the additional gas supply system does not increase rapidly, which lengthens time required for the additional gas to reach the processing chamber via the line of the additional gas supply system. Accordingly, a gas concentration in the processing chamber becomes stable after a lapse of a long period of time, which may deteriorate a throughput.

SUMMARY OF THE INVENTION

It is, therefore, an object of the present invention to provide a gas supply system and the like, capable of achieving a desired in-surface uniformity with a simple line configuration and shortening time required for supplying an additional gas by a simple control.

In accordance with an aspect of the invention, there is provided a gas supply system for supplying a gas into a processing chamber for processing a substrate to be processed, the system including:

a processing gas supply unit for supplying a processing gas for processing the substrate to be processed;

a processing gas supply line for allowing the processing gas from the processing gas supply unit to flow therein;

a first and a second branch line branched from the processing gas supply line to be connected with different portions of the processing chamber;

a branch flow control unit for controlling branch flows of the processing gas distributed from the processing gas supply line to the first and the second branch line based on inner pressures of the first and the second branch line, respectively;

an additional gas supply unit for supplying an additional gas;

an additional gas supply line, joining the second branch line at a downstream side of the branch flow control unit, for allowing the additional gas from the additional gas supply unit to flow therein; and a control unit for performing, before processing the substrate to be processed, a processing gas supply control and an additional gas supply control by using the processing gas supply unit and the additional gas supply unit, respectively, wherein the additional gas supply control includes a control that supplies the additional gas at an initial flow rate greater than a set flow rate and then at the set flow rate after a lapse of a period of time.

In accordance with another aspect of the invention, there is provided a substrate processing apparatus including:

a processing chamber for processing a substrate to be processed;

a gas supply system for supplying a gas into the processing chamber; and a control unit for controlling the gas supply system, wherein the gas supply system includes:

a processing gas supply unit for supplying a processing gas for processing the substrate to be processed;

a processing gas supply line for allowing the processing gas from the processing gas supply unit to flow therein;

a first and a second branch line branched from the processing gas supply line to be connected with different portions of the processing chamber;

a branch flow control unit for controlling branch flows of the processing gas distributed from the processing gas supply line to the first and the second branch line based on inner pressures of the first and the second branch line, respectively;

an additional gas supply unit for supplying an additional gas; and an additional gas supply line, joining the second branch line at a downstream side of the branch flow control unit, for allowing the additional gas from the additional gas supply unit to flow therein, and wherein the control unit performs, before processing the substrate to be processed, a processing gas supply control and an additional gas supply control by using the processing gas supply unit and the additional gas supply unit, respectively, wherein the additional gas supply control includes a control that supplies the additional gas at an initial flow rate greater than a set flow rate and then at the set flow rate after a lapse of a period of time.

In accordance with still another aspect of the invention, there is provided a gas supply method for use with a gas supply system for supplying a gas into a processing chamber for processing a substrate to be processed, wherein the gas supply system includes a processing gas supply unit for supplying a processing gas for processing the substrate to be processed; a processing gas supply line for allowing the processing gas from the processing gas supply unit to flow therein; a first and a second branch line branched from the processing gas supply line to be connected with different portions of the processing chamber; a branch flow control unit for controlling branch flows of the processing gas distributed from the processing gas supply line to the first and the second branch line based on inner pressures of the first and the second branch line, respectively; an additional gas supply unit for supplying an additional gas; and an additional gas supply line, joining the second branch line at a downstream side of the branch flow control unit, for allowing the additional gas from the additional gas supply unit to flow therein, the method including the steps of, before processing the substrate to be processed:

performing a control of supplying the processing gas at a first set flow rate from the processing gas supply unit; and performing a control of supplying the additional gas at an initial flow rate greater than a second set flow rate and then at the second set flow rate after a lapse of a period of time.

In accordance with the aforementioned aspects of the present invention, the processing gas from the processing gas supply unit are distributed to the first and the second branch line by the processing gas supply control and, also, the additional gas from the additional gas supply unit joins the second branch line via the additional gas supply line by the additional gas supply control. The processing gas distributed from the processing gas supply unit to the first branch line is supplied to the processing chamber without being changed, whereas the processing gas supplied from the processing gas supply unit to the second branch line is supplied to the processing chamber after adjusting components and a flow rate thereof with a specific additional gas added thereto. Therefore, the processing gas having same components can be supplied from a common processing gas supply unit to each of the branch lines and, also, the components or the flow rate of the processing gas flowing in the second branch line can be adjusted by adding thereto an additional gas on demand. Accordingly, the number of lines can be minimized and, thus, a simple line configuration can be accomplished. As a result, a desired in-surface uniformity can be achieved simply by controlling a flow rate.

When the additional gas is supplied, it is supplied at an initial flow rate greater than a set flow rate and then supplied at the set flow rate after a lapse of a period of time. Therefore, even when the set flow rate of the additional gas is very small, an inner pressure of the additional gas supply line can be rapidly increased, which makes easier for the additional gas to flow toward the second branch line in a short period of time. Hence, time required for supplying the additional gas can be shortened, which prevents to the utmost a deterioration of a throughput.

Preferably, the initial flow rate is predetermined based on a volume of the additional gas supply line in which the additional gas flows and the inner pressure of the second branch line into which the additional gas from the additional gas supply line flows. For example, the initial flow rate is preferably predetermined to be a maximum flow rate required for an inner pressure of the additional gas supply line to reach the inner pressure of the second branch line at the lapse of the period of time. Accordingly, it is possible to obtain an optimal initial flow rate at which an inner pressure of the additional gas supply line can be rapidly increased to that of the second branch line, which shortens time required from the initiation of the supply of the additional gas from the additional gas supply line to the accomplishment of a stable pressure thereof supplied to the processing chamber via the second branch line.

Preferably, the additional gas supply unit includes an additional gas line connected with an additional gas supply source, and wherein the additional gas supply control includes a control that sets, if the initial flow rate exceeds a maximum allowable flow rate in the additional gas line, the maximum allowable flow rate as the initial flow rate and lengthens the period of time to compensate for the reduction of the initial flow rate. Herein, the period of time is preferably determined to be a time required for the inner pressure of the additional gas supply line to reach the inner pressure of the second branch line when supplying the additional gas at the maximum allowable flow rate set as the initial flow rate. Hence, an initial processing can be carried out for an optimal initial time in accordance with a configuration of a substrate processing apparatus. Therefore, the additional gas supply control can be optimally performed without exceeding the maximum allowable flow rate of the additional gas line.

Preferably, the volume of the additional gas supply line is smaller than that of the second branch line. Accordingly, even when the set flow rate of the additional gas is very small compared with that of the processing gas, the inner pressure of the additional gas supply line can be rapidly increased.

Preferably, the first branch line is arranged to supply the processing gas flowing therein toward a central region on a surface of the substrate disposed in the processing chamber, and the second processing gas branch line is arranged to supply the processing gas flowing therein toward a peripheral region on the surface of the substrate. As a result, it is possible to improve an uniformity of processing the central region and the peripheral region of the substrate to be processed.

In accordance with still another aspect of the invention, there is provide a gas supply system for supplying a gas into a processing chamber for processing a substrate to be processed, the system including:

a processing gas supply unit for supplying a processing gas for processing the substrate to be processed;

a processing gas supply line for allowing the processing gas from the processing gas supply unit to flow therein;

a first and a second branch line branched from the processing gas supply line to be connected with different portions of the processing chamber;

a branch flow control unit for controlling branch flows of the processing gas distributed from the processing gas supply line to the first and the second branch line based on inner pressures of the first and the second branch line, respectively;

an additional gas supply unit having a plurality of additional gas lines respectively connected with additional gas sources, downstream sides of the additional gas lines being joined together;

an additional gas supply line, joining the second branch line at a downstream side of the branch flow control unit, for allowing additional gases from the additional gas supply unit to flow therein; and a control unit for performing, before processing the substrate to be processed, a processing gas supply control and an additional gas supply control by using the processing gas supply unit and the additional gas supply unit, respectively, wherein the additional gas supply control includes a control that supplies an additional gas in each additional gas line at an initial flow rate greater than a set flow rate in each additional gas line and then at the set flow rate after a lapse of a period of time.

In accordance with the aforementioned aspect of the present invention, even when the additional gas supply unit has a plurality of additional gas lines, the time required for supplying the additional gases can be shortened by controlling the additional gas in each additional gas line to be supplied at an initial flow rate and, thus, a deterioration of a throughput can be prevented to the utmost.

Preferably, the initial flow rate in each additional gas line is obtained such that a ratio of the initial flow rate in each additional gas line to a total initial flow rate in whole additional gas lines is equal to a ratio of a set flow rate in said each additional gas line to a total set flow rate in the whole additional gas lines, the total initial flow rate being a predetermined maximum flow rate required for an inner pressure of the additional gas supply line to reach the inner pressure of the second branch line after the lapse of the period of time. Therefore, the additional gas in each additional gas line can be controlled to be supplied at an initial flow rate in accordance with a set flow rate ratio of the additional gas lines.

The additional gas supply control may include a control of setting, in case an initial flow rate in any additional gas line exceeds a maximum allowable flow rate thereof, the maximum allowable flow rate as the initial flow rate in said any additional gas line and redetermining an initial flow rate in each remaining additional gas line and the period of time. Accordingly, the additional gas supply control can be optimally performed without exceeding a maximum allowable flow rate in each of the additional gas lines. Hence, the initial processing can be carried out for an optimal initial time in accordance with a configuration of a substrate processing apparatus.

BRIEF DESCRIPTION OF THE DRAWINGS

The above and other objects and features of the present invention will become apparent from the following description of preferred embodiments, given in conjunction with the accompanying drawings, in which:

FIG. 6 represents a graph describing experimental data of an additional gas supply process performed at the initial flow rate of FIG. 4 while changing a line diameter and the like;

FIG. 7 offers a graph showing experimental data of an additional gas supply process performed at the initial flow rate of FIG. 5 while changing a line diameter and the like;

FIG. 9 depicts a configuration example of a data table of gas supply process data of FIG. 8;

FIG. 10 describes a flowchart of a specific example of an initial flow rate determining process in accordance with the embodiment of the present invention;

FIG. 15 illustrates another configuration example of the data table of the gas supply process data of FIG. 8;

DETAILED DESCRIPTION OF THE PREFERRED EMBODIMENT

Figure 1:
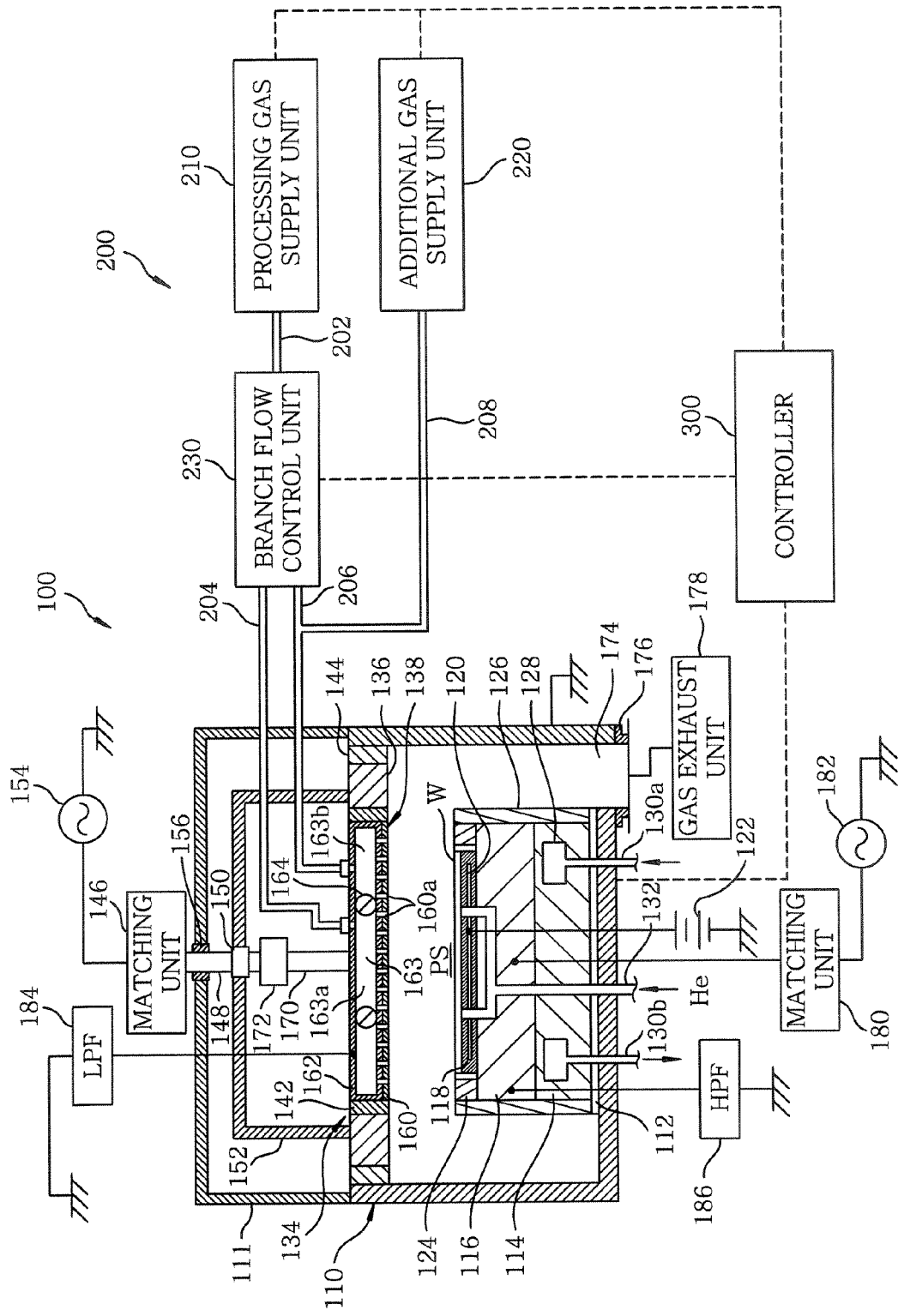
FIG. 1 shows a cross sectional view of a configuration example of a substrate processing apparatus in accordance with an embodiment of the present invention.

Hereinafter, embodiments of the present invention will be described in detail with reference to the accompanying drawings. Like reference numerals will be given to like parts having substantially the same functions, and redundant description thereof will be omitted in the specification and the accompanying drawings.

(Configuration Example of Substrate Processing Apparatus)

First of all, a substrate processing apparatus in accordance with an embodiment of the present invention will be described with reference to FIG. 1. FIG. 1 is a cross sectional view showing a schematic configuration of the substrate processing apparatus in accordance with the embodiment of the present invention. Herein, the substrate processing apparatus is configured as a parallel plate type plasma etching apparatus.

Such a substrate processing apparatus 100 includes a processing chamber 110 formed of a substantially cylindrical processing vessel. The processing vessel is made of aluminum alloy, for example, and is electrically grounded. Further, an inner wall surface of the processing vessel is coated with an alumina film or an yttrium oxide film.

Disposed inside the processing chamber 110 is a susceptor 116 forming a lower electrode serving also as a mounting table for mounting thereon a wafer W as a substrate. To be specific, the susceptor 116 is supported on a cylindrical susceptor support 114 which is provided at a substantially central portion of an inner bottom surface of the processing chamber 110 with an insulating plate 112 disposed therebetween. The susceptor 116 is made of aluminum alloy, for example.

Provided on the susceptor 116 is an electrostatic chuck 118 for supporting the wafer W. The electrostatic chuck 118 has therein an electrode 120 that is electrically connected with a DC power supply 122. Accordingly, the electrostatic chuck 118 can attract and hold thereon the wafer W with the Coulomb force generated by a DC voltage applied from the DC power supply 122 to the electrode 120.

Moreover, a focus ring 124 is provided on top of the substrate 116 to surround the electrostatic chuck 118. Further, a cylindrical inner wall member 126 made of quartz, for example, is attached to outer peripheral surfaces of the susceptor 116 and the susceptor support 114.

A ring-shaped coolant chamber 128 is formed inside the susceptor support 114 to communicate with a chiller unit (not shown), for example, installed outside the processing chamber 110 via lines 130a and 130b. A coolant (liquid coolant or cooling water) is supplied to the coolant chamber 128 to be circulated therein via the lines 130a and 130b, so that a temperature of the wafer W on the susceptor 116 can be controlled.

A gas supply line 132 is provided through a top surface of the electrostatic chuck 118 via the susceptor 116 and the susceptor support 114. Accordingly, a thermally conductive gas (backside gas) such as He gas or the like can be supplied between the wafer W and the electrostatic chuck 118 through the gas supply line 132.

Provided above the susceptor 116 is an upper electrode 134 facing in parallel with the susceptor 116 forming the lower electrode. A plasma generation space PS is formed between the susceptor 116 and the upper electrode 134.

The upper electrode 134 includes a circular plate-shaped inner upper electrode 138 and a ring-shaped outer upper electrode 136 surrounding an outer portion of the inner upper electrode 138. A ring-shaped dielectric material 142 is interposed between the outer upper electrode 136 and the inner upper electrode 138. Airtightly interposed between the outer upper electrode 136 and an inner peripheral wall of the processing chamber 110 is a ring-shaped insulating shielding member 144 made of alumina, for example.

A first high frequency power supply 154 is electrically connected with the outer upper electrode 136 via a power feeder 152, a connector 150, an upper power supply rod 148 and a matching unit 146. The first high frequency power supply 154 can output a high frequency voltage having a frequency of 40 MHz or higher (e.g., 60 MHz).

The power feeder 152 is formed in a substantially cylindrical shape having an open bottom, for example, and has a lower portion connected with the outer upper electrode 136. A lower portion of the upper power supply rod 148 is electrically connected with an upper central portion of the power feeder 152 through the connector 150. An upper portion of the upper power supply rod 148 is connected with an output side of the matching unit 146. The matching unit 146 is connected with the first high frequency power supply 154 and thus can match an internal impedance of the first high frequency power supply 154 to a load impedance.

An exterior of the power feeder 152 is covered with a cylindrical ground conductor 111 having a sidewall of a diameter substantially same as that of the processing chamber 110. A lower portion of the ground conductor 111 is connected with an upper portion of the sidewall of the processing chamber 110. The aforementioned upper power supply rod 148 penetrates through an upper central portion of the ground conductor 111. An insulation member 156 is interposed at a contact portion between the ground conductor 111 and the upper power supply rod 148.

The inner upper electrode 138 forms a shower head for injecting a specific gas on the wafer W mounted on the susceptor 116. Further, the inner upper electrode 138 includes a circular electrode plate 160 having a plurality of gas injection openings 160a and an electrode support 162 for attachably and detachably supporting a top surface of the electrode plate 160. The electrode support 162 is formed in a circular plate shape having a diameter substantially same as that of the electrode plate 160.

The electrode support 162 forms therein a buffer chamber 163 of a circular plate-shaped space. An annular partition wall member 164 provided in the buffer chamber 163 partitions the buffer chamber 163 into an inner and an outer buffer chamber, i.e., a first buffer chamber 163a formed of a circular plate-shaped space and a second buffer chamber 163b formed of a ring-shaped space surrounding the first buffer chamber 163a. The annular partition wall member 164 is formed of an O-ring, for example.

The first and the second buffer chamber 163a and 163b are configured to respectively face a central region (central portion) of the wafer W on the susceptor 116 and an outer peripheral region (edge portion) thereof surrounding the central region.

The gas injection openings 160a communicate with bottom surfaces of the buffer chambers 163a and 163b, thereby allowing a specific gas to be injected through the first and the second buffer chamber 163a and 163b to the central and the edge portion of the wafer W, respectively. A gas supply system 200 is configured to supply the specific gas to each of the buffer chambers 163a and 163b.

As shown in FIG. 1, a lower power feeder 170 is electrically connected with a top surface of the electrode support 162. The lower power feeder 170 is connected with the upper power supply rod 148 via the connector 150. A variable condenser 172 is provided in the lower power feeder 170. By adjusting an electrostatic capacitance of the variable condenser 172, it is possible to adjust a comparative ratio between an intensity of an electric field formed right under the outer upper electrode 136 and that of an electric field formed right under the inner upper electrode 138, the electric fields being formed by the high frequency voltage applied from the first high frequency power supply 154.

A gas exhaust port 174 is formed at a bottom portion of the processing chamber 110 and connected via a gas exhaust line 176 with a gas exhaust unit 178 having a vacuum pump and the like. By exhausting an inside of the processing chamber 110 with the use of the gas exhaust unit 178, the inside of the processing chamber 110 can be depressurized to a desired vacuum level.

A second high frequency power supply 182 is electrically connected with the susceptor 116 via a matching unit 180. The second high frequency power supply 182 can output a high frequency voltage having a frequency between 2 MHz and 20 MHz, e.g., a frequency of 2 MHz.

A low pass filter 184 is electrically connected with the inner upper electrode 138 of the upper electrode 134. The low pass filter 184 blocks the high frequency power from the first high frequency power supply 154 and passes the high frequency from the second high frequency power supply 182 to the ground. Meanwhile, a high pass filter 186 is electrically connected with the susceptor 116 forming the lower electrode. The high pass filter 186 passes the high frequency power from the first high frequency power supply 154 to the ground.

(Gas Supply System)

Hereinafter, the gas supply system 200 will be described with reference to FIG. 1. Referring to FIG. 1, there is shown an example in which the processing gas is divided into a first processing gas (processing gas for the central portion) to be supplied toward the central portion of the wafer W and a second processing gas (processing gas for the edge portion) to be supplied toward the edge portion of the wafer W. However, there may be provided another example in which the processing gas is divided into more than three types without being limited to the aforementioned two types.

As shown in FIG. 1, the gas supply system 200 includes a processing gas supply unit 210 for supplying processing gas for performing on a wafer a specific process such as a film formation process, an etching process or the like and an additional gas supply unit 220 for supplying specific additional gas. The processing gas supply unit 210 is connected with a processing gas supply line 202 forming a processing gas feed passage. Further, the processing gas is supply line 202 is branched into a first branch line 204 forming a first branch path and a second branch line 206 forming a second branch path. The first and the second branch line 204 and 206 may be branched at a position inside or outside a branch flow control unit 230.

The first and the second branch line 204 and 206 are respectively connected with different portions of the upper electrode 134 in the processing chamber 110, e.g., with the first and the second buffer chamber 163a and 163b of the inner upper electrode 138.

The gas supply system 200 includes the branch flow control unit (e.g., flow splitter) 230 for controlling respective branch flows of the first and the second processing gas flowing in the first and the second branch line 204 and 206 based on respective inner pressures of the first and the second branch line 204 and 206. Further, the additional gas supply unit 220 is connected with the second branch line 206 at a position in a downstream side of the branch flow control unit 230 via an additional gas supply line 208.

The gas supply system 200 distributes the processing gas from the processing gas supply unit 210 into the first and the second branch line 204 and 206 while controlling branch flows thereof with the use of the branch flow control unit 230. The first processing gas flowing in the first branch line 204 is supplied toward the central portion of the wafer W via the first buffer chamber 163a, whereas the second processing gas flowing in the second branch line 206 is supplied toward the edge portion of the wafer W via the second buffer chamber 163b.

To be specific, when the additional gas is supplied from the additional gas supply unit 220, the additional gas flows toward the second branch line 206 via the additional gas supply line 208 and thus is mixed with the second processing gas. Then, the additional gas is supplied, together with the second processing gas, toward the edge portion of the wafer W via the second buffer chamber 163b. A specific configuration example of the gas supply system 200 will be described later.

The substrate processing apparatus 100 is connected with a controller 300 for controlling each unit thereof. The controller 300 is configured to control the DC power supply 122, the first high frequency power supply 154, the second high frequency power supply 182 and the like in addition to the gas supply system 200 including the processing gas supply unit 210, the additional gas supply unit 220, the branch flow control unit 230 and the like.

(Specific Configuration Example of Gas Supply System)

Figure 2:
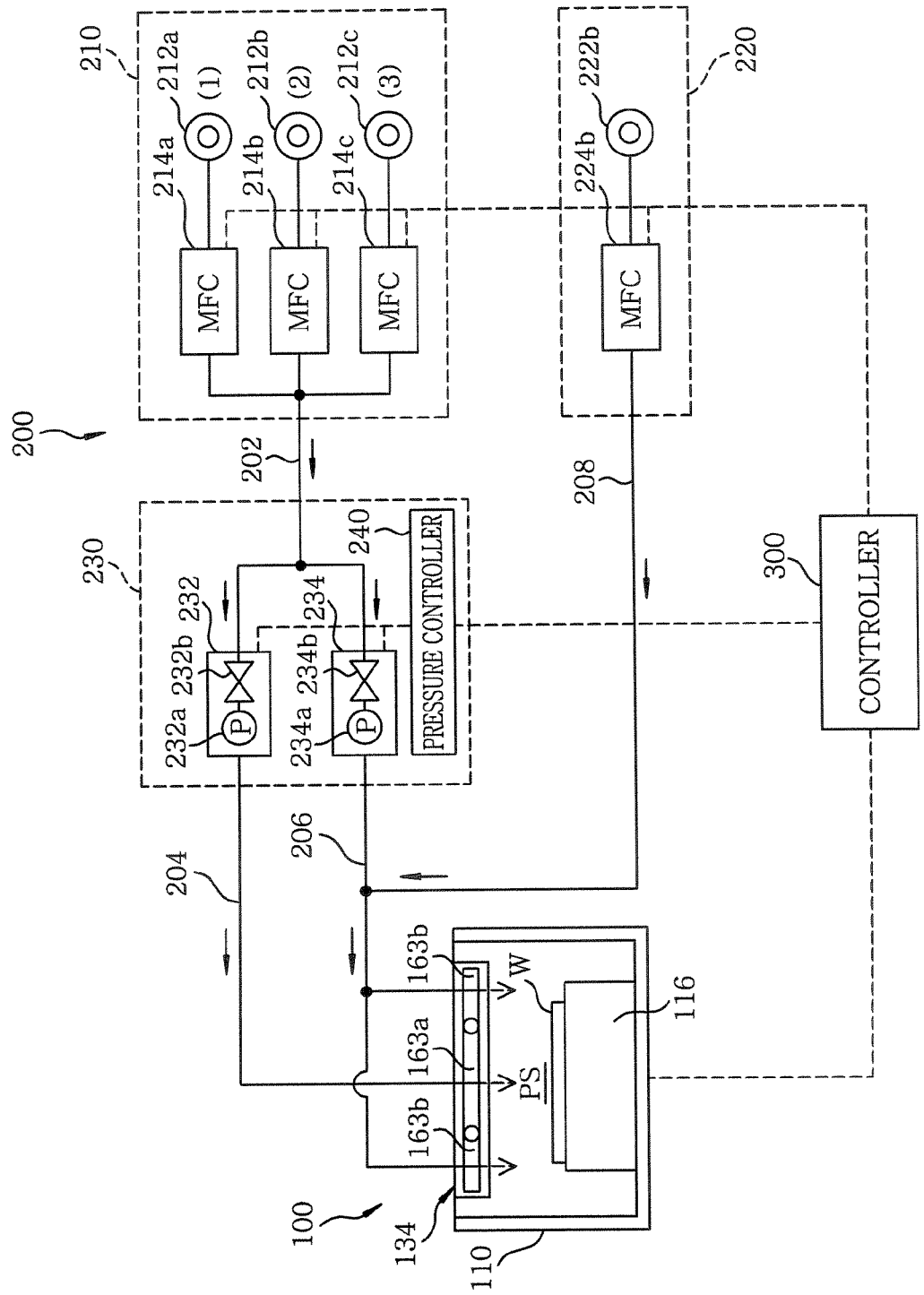
FIG. 2 describes a block diagram of a configuration example of a gas supply system in accordance with the embodiment of the present invention.

The following is a detailed description on a configuration example of each unit of the gas supply system 200. FIG. 2 is a block diagram illustrating a specific configuration example of the gas supply system 200. Hereinafter, there will be described a case where the additional gas supply unit has an additional gas line.

As shown in FIG. 2, the processing gas supply unit 210 includes a gas box accommodating therein a plurality of (e.g., three) processing gas lines 1 to 3. At respective upstream sides of the processing gas lines 1 to 3, gas supply sources 212a to 212c are provided, respectively. Further, downstream sides of the processing gas lines 1 to 3 are joined to be connected with the processing gas supply line 202. Provided on the processing gas lines 1 to 3 are mass flow controllers 214a to 214c for adjusting respective flow rates of the gases from the gas supply sources 212a to 212c. The gases from the gas supply sources 212a to 212c of the processing gas supply unit 210 are mixed at a preset flow rate ratio. Next, the mixed gas flows along the processing gas supply line 202 and then is distributed into the first and the second branch line 204 and 206.

The gas supply source 212a airtightly seals therein, e.g., a $C_XF_Y$ gas (a fluorocarbon-based fluorine compound such as $CF_4$, $C_4F_6$, $C_4F_8$, $C_5F_8$ or the like) as an etching gas; the gas supply source 212b airtightly seals therein, e.g., an $O_2$ gas as a gas for controlling a deposition of CF-based reaction products; and the gas supply source 212c airtightly seals therein, e.g., an Ar gas as a rare gas serving as a carrier gas. The number of gas supply sources of the processing gas supply unit 210 may be one, two or four or more without being limited to the example shown in FIG. 2.

As exemplarily shown in FIG. 2, the additional gas supply unit 220 includes a gas box accommodating therein an additional gas line. The additional gas line is connected, at the upstream side thereof, with a gas supply source 222a, and, at the downstream side thereof, with the additional gas supply line 208. Provided on the additional gas line is a mass flow controller 224a for adjusting a flow rate of the gas from the gas supply source 222a. The gas from the gas supply source 222a of the additional gas supply unit 220 flows along the additional gas supply line 208 and then is supplied to the second branch line 206 at a downstream side of the branch flow control unit 230.

The gas supply source 222a airtightly seals therein a $C_XF_Y$ gas (e.g., a $CF_4$ gas) capable of facilitating an etching, for example. Further, the gas supply source 222a may airtightly seal therein an $O_2$ gas capable of controlling a deposition of CF-based reaction products, for example. The number of gas supply sources of the additional gas supply unit 220 may be more than two without being limited to the example shown in FIG. 2.

The branch flow control unit 230 includes a pressure control unit 232 for controlling an inner pressure of the first branch line 204 and a pressure control unit 234 for controlling an inner pressure of the second branch line 206. To be specific, the pressure control unit 232 has a pressure sensor 232a for detecting an inner pressure of the first branch line 204 and a valve 232b for controlling an opening degree of the first branch line 204. The pressure controller 234 has a pressure sensor 234a for detecting an inner pressure of the second branch line 206 and a valve 234b for controlling an opening degree of the second branch line 206.

The pressure control units 232 and 234 are connected with a pressure controller 240 for controlling, in accordance with instructions from the controller 300, opening degrees of the valves 232b and 234b based on the pressures detected by the pressure sensors 232a and 234a, respectively. The controller 300 controls the branch flow control unit 230 by regulating a pressure ratio, for example. In such a case, the pressure controller 240 controls respective opening degrees of the valves 232b and 234b to achieve a target flow rate ratio between the first and the second processing gas in accordance with instructions from the controller 300, i.e., a target pressure ratio between the inner pressures of the first and the second branch line 204 and 206. The pressure controller 240 may be built in the branch flow control unit 230, as a control board, or may be provided separately from the branch flow control unit 230. Further, the pressure controller 240 may be provided inside the controller 300.

In such a substrate processing apparatus 100, before an etching process and the like are performed on the wafer, the gas supply system 200 supplies a specific gas into the processing chamber 110. To be specific, the supply of the processing gas from the processing gas supply unit 210 is initiated and, then, the branch flow control unit 230 is pressure-ratio-controlled. After the pressure ratio between the inner pressures of the first and the second branch line 204 and 206 is regulated to be kept at the target pressure ratio, the additional gas from the additional gas supply unit 220 is supplied to the second branch line 206.

In case the additional gas is supplied while it is controlled to be supplied at a set flow rate from the beginning, time required for the additional gas to reach the processing chamber via the additional gas supply line 208 is lengthened. For example, the processing gas is already flowing in the second branch line 206 where the additional gas flows toward, so that a pressure of a specific level has been generated therein. Therefore, if the set flow rate of the additional gas is very small (e.g., a few sccm), a pressure difference between the additional gas supply line 208 and the second branch line 206 is great, which hinders a flow of the additional gas. In this case, the additional gas gradually fills the additional gas supply line 208, so that an inner pressure of the additional gas supply line 208 gradually increases. When the pressure difference between the additional gas supply line 208 and the second branch line 206 becomes small, the additional gas flows toward the second branch line 206 and thus reaches the processing chamber 110. In other words, if the additional gas is supplied at the set flow rate from the beginning, time required for supplying the additional gas is lengthened.

Figure 3:
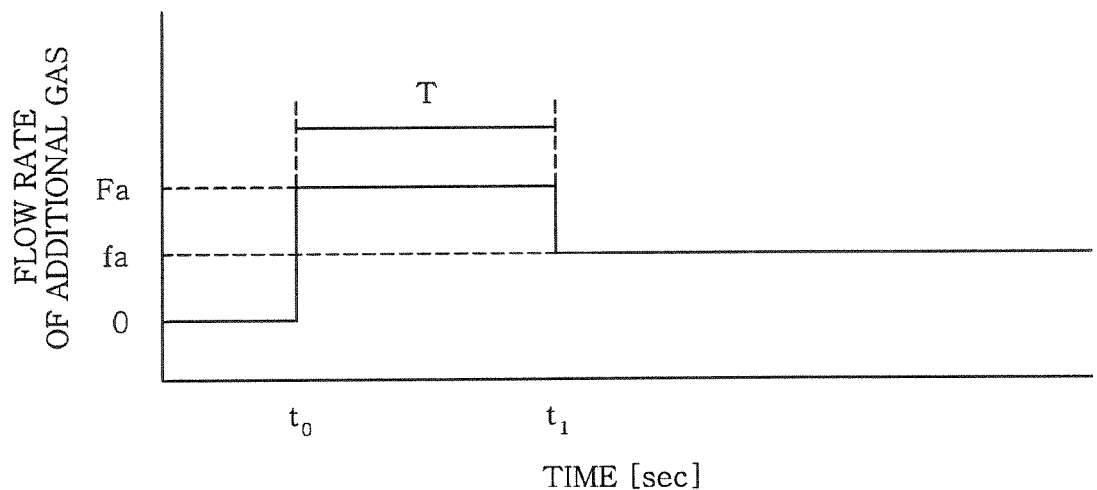
FIG. 3 illustrates timing of an additional gas supply control in performing an additional gas supply process in accordance with the embodiment of the present invention.

In order to rapidly increase the inner pressure of the additional gas supply line 208 upon the supply of the additional gas, the present invention performs an additional gas supply control (additional gas supply process) for supplying the additional gas at an initial flow rate Fa (at the time $t_0$) greater than a set flow rate fa and then at the set flow rate fa after lapse of a period of time T (e.g., a few seconds), as shown in FIG. 3. Accordingly, the inner pressure of the additional gas supply line 208 can be immediately increased, which makes easier for the additional gas to flow toward the second branch line 206. Hence, it is possible to shorten time required from the initiation of the supply of the additional gas to the accomplishment of a stable pressure (gas concentration) thereof supplied to the processing chamber 110, which prevents to the utmost a deterioration of a throughput.

Figure 4:
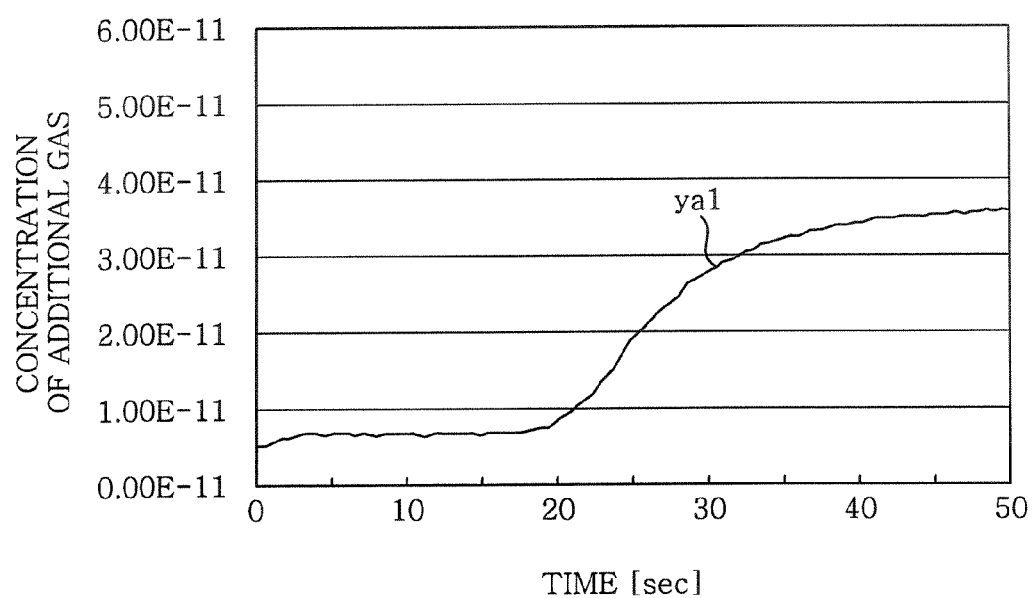
FIG. 4 provides a graph showing experimental data of an additional gas supply process performed at a specific initial flow rate.
Figure 5:
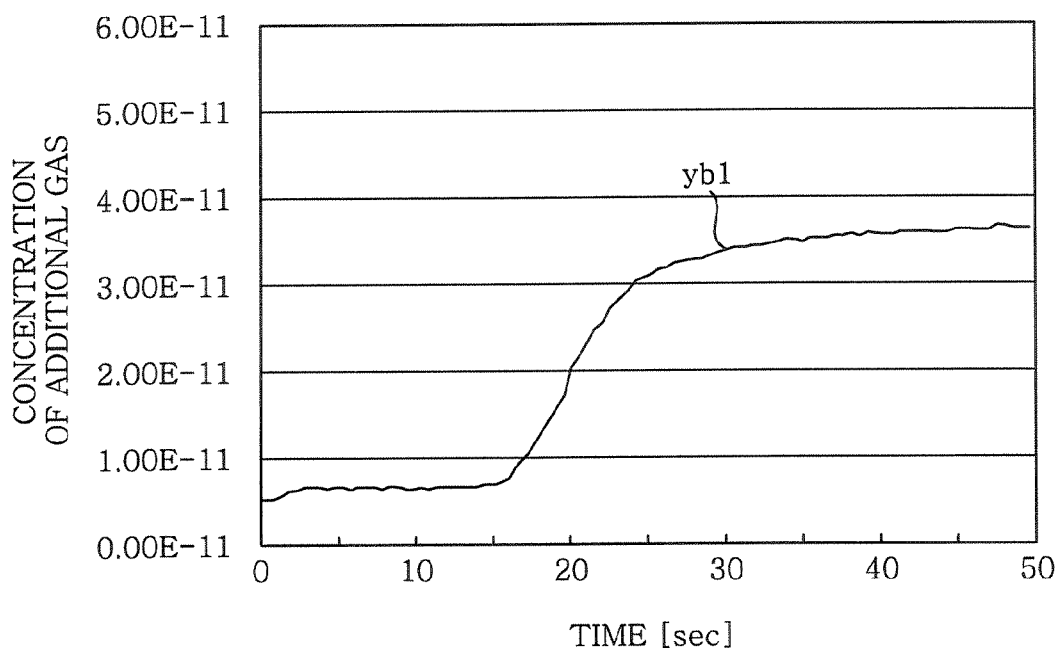
FIG. 5 presents a graph illustrating experimental data of an additional gas supply process performed at another initial flow rate.

FIGS. 4 and 5 illustrate results of experiments in which the additional gas was supplied while changing the initial flow rate Fa by the aforementioned additional gas supply process. Referring to FIGS. 4 and 5, there are shown experimental data obtained when the additional gas having the set flow rate fa of 7 sccm was supplied at the initial flow rates Fa of 21 sccm and 50 sccm. Herein, time T for allowing the additional gas to be supplied at the initial flow rates Fa was set to be one second. Further, ya1 and yb1 shown in the graphs of FIGS. 4 and 5 indicate concentrations of $O_2$ gas serving as an additional gas, wherein the concentrations are detected by a gas concentration measuring device attached to a gas inlet port of the processing chamber 110. Moreover, horizontal and vertical axes in FIGS. 4 and 5 represent the time and the gas concentration, respectively. As can be seen therefrom, the concentration of $O_2$ gas varies depending on flow rates of $O_2$ gas supplied to the gas inlet port of the processing chamber 110, so that a flow rate variation of the additional gas supplied to the processing chamber 110 can be estimated from the gas concentration variation.

Referring to the experimental data shown in FIGS. 4 and 5, an inclination of a gas concentration variation curve becomes sharp as the initial flow rates Fa increase. Accordingly, as the initial flow rates Fa increase, time required from the initiation of the supply of the additional gas to the accomplishment of a stable gas concentration thereof supplied to the processing chamber 110 is shortened. As shown in FIGS. 4 and 5, about 26.1 seconds and about 20.2 seconds were actually detected as the time required from the initiation of the supply of the additional gas to the accomplishment of the stable gas concentration thereof supplied to the processing chamber 110 (additional gas supply time). On the other hand, in case the additional gas was supplied at the set flow rate from the beginning, tens of seconds were required therefor. Hence, the additional gas supply time can be greatly shortened by performing the additional gas supply process of the present invention.

Besides, in order to rapidly increase the inner pressure of the additional gas supply line 208 upon the supply of the additional gas, it is preferable to reduce a volume of the additional gas supply line 208. Since the volume of the additional gas supply line 208 varies depending on a line diameter and a line length, the inner pressure of the additional gas supply line 208 can be more rapidly increased by reducing the line diameter or the line length.

Figure 6:
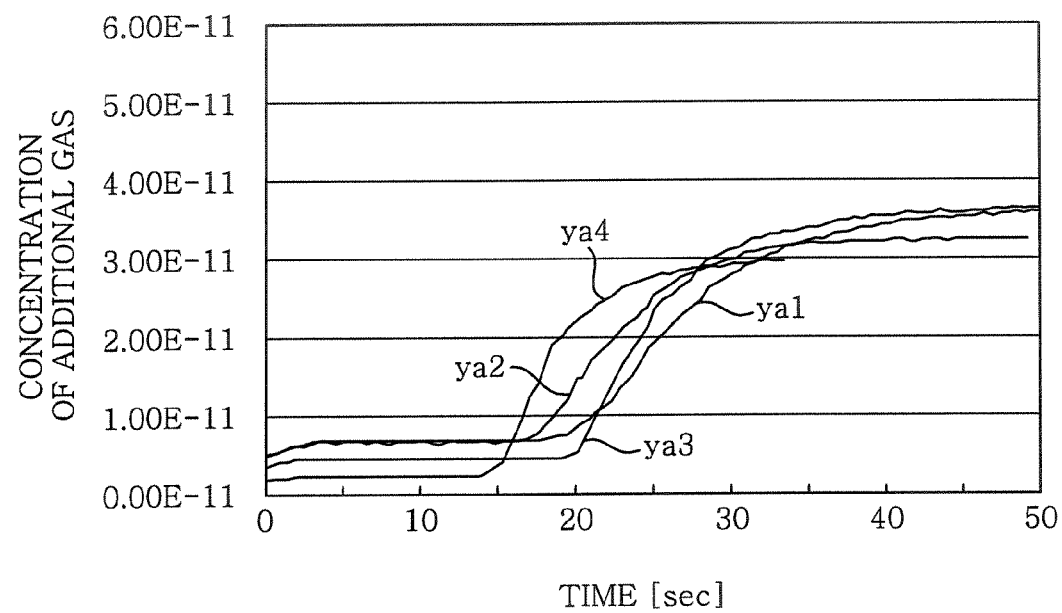
Figure 7:
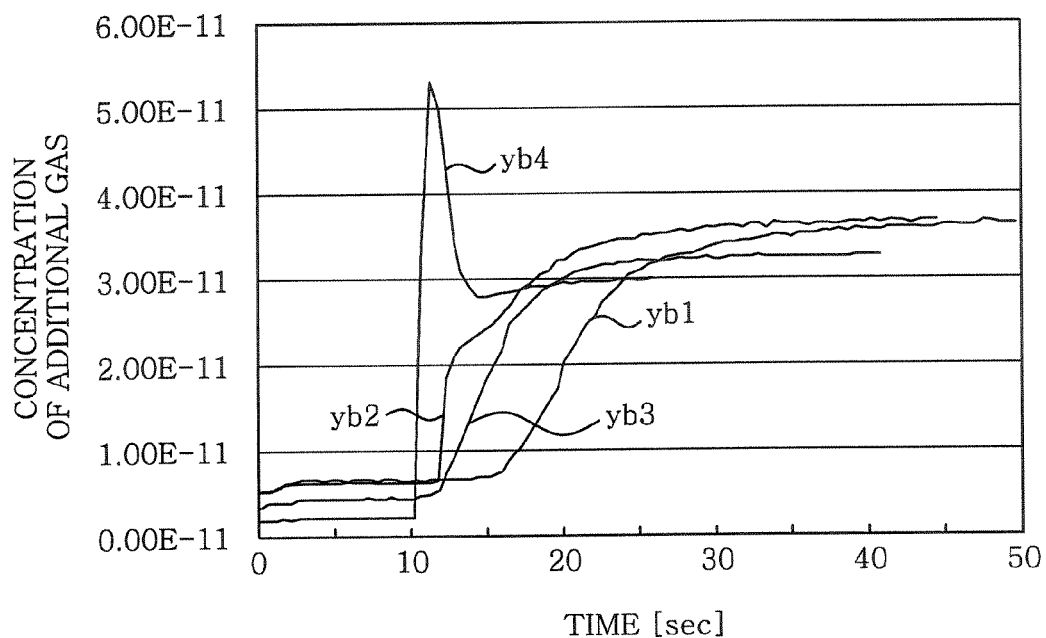

FIGS. 6 and 7 illustrate results of experiments in which the additional gas was supplied while varying a line diameter and a line length of the additional gas supply line 208. Further, FIGS. 6 and 7 illustrate experimental data obtained when the additional gas was supplied at the initial flow rates of FIGS. 4 and 5, respectively.

Notations of ya2 and yb2 in FIGS. 6 and 7 indicate specific examples of using a line having a diameter half of that of the additional gas supply line 208 of FIGS. 4 and 5. Further, notations of ya3 and yb3 in FIGS. 6 and 7 represent specific examples of using a filter having a length shorter than that of a filter attached in the additional gas supply line 208 of FIGS. 4 and 5.

Moreover, notations of ya4 and yb4 in FIGS. 6 and 7 indicate specific examples of using the line having the diameter reduced by half and the filter having the shorter length. In this experiment, a length of the line was changed by changing a length of the filter provided in the additional gas supply line 208.

In this experiment, about 19.4 seconds, about 21 seconds and about 13.9 seconds were detected in ya2, ya3 and ya4 of FIG. 6 as the time required from the initiation of the supply of the additional gas to the accomplishment of the stable gas concentration thereof supplied to the processing chamber 110 (additional gas supply time). Further, about 10.9 seconds, about 10 seconds and about 5.6 seconds were detected in yb2, yb3 and yb4 of FIG. 7.

As can be seen from the experimental data of FIGS. 6 and 7, the additional gas supply time is shortened as a line diameter of the additional gas supply line 208 and a length of the filter (line length) decrease. The additional gas supply time is further shortened by reducing the line diameter and the length of the filter (line length) while increasing the initial flow rate Fa.

Accordingly, it is preferable to reduce a volume of the additional gas supply line 208 by controlling the line diameter or the line length. For example, even in case the set flow rate fa of the additional gas is very small compared with a total set flow rate fm of the processing gas, it is possible to rapidly increase an inner pressure of the additional gas supply line 208 by reducing a volume of the additional gas supply line 208 than that of the second branch line 206.

If the initial flow rate Fa of the additional gas is increased, the inner pressure of the additional gas supply line 208 increases more rapidly, which facilitates a flow of the additional gas. Hence, the inner pressure thereof temporarily overshoots the set flow rate fa and then becomes stable at the set flow rate fa (see, e.g., yb4 of FIG. 7). In case the overshoot occurs, the time required until the gas concentration becomes stable is shortened. Moreover, the overshoot increases as the initial flow rate Fa increases, thereby shortening the time required until the gas concentration becomes stable.

However, an excessive increase in the overshoot may lengthen the time required until the gas concentration becomes stable. For example, when the inner pressure of the additional gas 208 is excessively higher than that of the second branch line 206 where the additional gas flows toward, the additional gas flows all at once. Consequently, the overshoot increases, thereby lengthening the time required until the gas concentration becomes stable.

To that end, the present invention performs the additional gas supply process after determining an optimal value of the initial flow rate Fa of the additional gas before supplying the gas to the processing chamber 110. Preferably, the optimal value of the initial flow rate Fa is set to be a maximum flow rate at which the inner pressure of the additional gas supply line 208 reaches that of the second branch line 206 at a lapse of a period of time. Since it is possible to determine the optimal initial flow rate Fa in accordance with a line configuration of the gas supply system, the additional gas supply time can be further shortened.

Hereinafter, the additional gas supply process of the present invention will be described in detail. The additional gas supply process is included in a series of gas supply processes for supplying a processing gas and an additional gas to the processing chamber 110. Such a gas supply process is performed by a program stored in a controller 300.

(Configuration Example of Controller)

Figure 8:
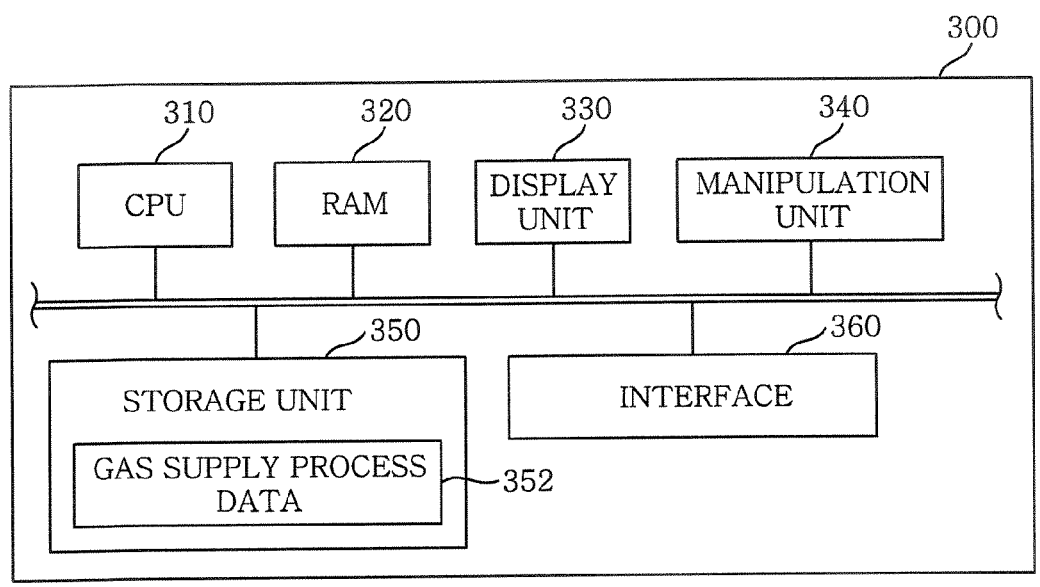
FIG. 8 provides a block diagram of a configuration example of a control unit in accordance with the embodiment of the present invention.

Hereinafter, a specific configuration example of the controller 300 will be described with reference to FIG. 8. FIG. 8 provides a block diagram showing a configuration example of the controller 300. As shown in FIG. 2, the controller 300 includes a CPU (central processing unit) 310 forming a controller main body; a RAM (random access memory) 320 having a memory area used for various data processing performed by the CPU 310; a display unit 330 formed of a liquid crystal display and the like for displaying a manipulation screen, a selection screen and the like; a manipulation unit 340 containing a touch panel and the like for allowing an operator to input or edit various data such as process recipes and the like and to output various data such as the process recipes or process logs to a specific storage medium; a storage unit 350; and an interface 360.

The storage unit 350 stores therein, e.g., processing programs for performing various processes (e.g., a gas supply process, an initial supply process of the additional gas and the like) of the substrate processing apparatus 100, information (e.g., gas supply process data) required for executing the processing programs and the like. Such a storage unit 350 includes, e.g., a memory, an HDD (hard disk drive) and the like. The CPU 310 reads the program data and the like on demand and executes various processing programs. For example, the CPU 310 performs a gas supply process for supplying a specific gas into the processing chamber 110 before processing the wafer. As the gas supply process, a processing gas supply process (processing gas supply control) and an additional gas supply process (additional gas supply control) are performed after determining an initial flow rate of the additional gas. Such a gas supply process is carried out based on gas supply process data 352 stored in the storage unit 350.

The gas supply process data 352 has a data table shown in FIG. 9, for example. The data table at least stores therein processing gas data and additional gas data. Installed in the data table shown in FIG. 9 is a storage area for storing therein, as the processing gas data, set flow rates fm(1) to fm(3) of the processing gas lines 1 to 3, a total set flow rate fm (=fm(1)+fm(2)+fm(3)) of the processing gas flowing in the processing gas supply line 202 and a flow rate ratio C:E between the first and the second processing gas. On the assumption that the total set flow rate fm of the processing gas is 100, the flow rate ratio E of the second processing gas can be easily obtained by subtracting C from 100, i.e., E=100−C. Further, installed in the data table shown in FIG. 9 is a storage area for storing therein, as the additional gas data, a set flow rate fa of the additional gas line, an initial flow rate Fa of the additional gas and an initial time T corresponding to a period of time for allowing the additional gas to be supplied at the initial flow rate Fa.

The set flow rates of the processing gas and the additional gas in the gas supply process data 352 can be preset, for example, by an operator's manipulating the manipulation unit 340. The initial flow rate Fa of the additional gas is determined by an initial flow rate determining process to be described later. Although the initial time T is preset as a default value (e.g., one second), it can be changed by an operator's manipulating the manipulation unit 340.

The interface 360 is connected with each unit controlled by the CPU 310, such as the branch flow control unit 230, the processing gas supply unit 210, the additional gas supply unit 220 and the like. The interface 360 includes a plurality of I/O ports and the like, for example.

The CPU 310, the RAM 320, the display unit 330, the manipulation unit 340, the storage unit 350, and the interface 360 are connected with each other by bus lines such as a control bus, a data bus and the like.

(Process for Determining Initial Flow Rate of Additional Gas)

In the gas supply process performed by the controller 300, the initial flow rate of the additional gas is determined before supplying the gas to the processing chamber 110. A specific example of the initial flow rate determining process is illustrated in FIG. 10. As shown in FIG. 10, the controller 300 calculates, in a step S110, a flow rate fe of the second processing gas based on the total set flow rate fm of the processing gas and the flow rate ratio C:E between the first and the second processing gas, both being obtained from the gas supply process data 352. To be specific, the flow rate fe of the second processing gas is calculated by using Equation 1-1;

$$fe = [Ne \cdot E/(Nc \cdot C + Ne \cdot E)] \cdot fm, \quad \text{Equation 1-1}$$

wherein C and E indicate a flow rate ratio of the first processing gas and that of the second processing gas, respectively. Further, Nc and Ne represent known parameters determined by a configuration of the substrate processing apparatus 100 (e.g., a configuration of the upper electrode 134). To be specific, Nc and Ne respectively indicate the number of gas injection openings 160a in the central portion, i.e., in the first buffer chamber 163a, and that of the gas injection openings 160a in the edge portion, i.e., in the second buffer chamber 163b.

Next, the set flow rate fa of the additional gas is obtained from the gas supply process data 352 in a step S120 Then, a total flow rate Fe (=a flow rate fe of the second processing gas+the set flow rate fa of the additional gas) of the gases flowing in the second branch line is determined in a step S130.

Thereafter, an inner pressure Pe of the second branch line 206 is determined, in a step S140, based on the total flow rate Fe of the gases. To be specific, when the set flow rate fa of the additional gas is smaller than a specific pressure (e.g., 500 sccm), the inner pressure Pe thereof can be obtained by using Equation 1-2;

$$Pe = p1 \cdot Fe^{p2}, \quad \text{Equation 1-2}$$

wherein p1 and p2 indicate parameters serving as conversion factors for the inner pressure of the second branch line. On the other hand, when the set flow rate fa of the additional gas is greater than the specific pressure (e.g., 500 sccm), the inner pressure Pe thereof can be obtained by using a Equation 1-3;

$$Pe = q1 \cdot Fe + q2, \quad \text{Equation 1-3}$$

wherein q1 and q2 indicate parameters serving as conversion factors for the inner pressure of the second branch line.

Next, the initial flow rate Fa of the additional gas is determined and stored in a step S150. To be specific, the initial flow rate Fa is determined based on the inner pressure Pe of the second branch line by using Equation 1-4 while fixing the initial time T to a period of time (e.g., one second). Referring to Equation 1-4, an optimal value of the initial flow rate Fa can be determined based on a volume of the additional gas supply line 208 for allowing the additional gas to flow therein and the inner pressure Pe of the second branch line 206 where the additional gas from the additional gas supply line 208 flows toward:

$$Fa = \alpha \cdot (Pe/P) \cdot \beta \cdot 60 \cdot v/(T-\gamma), \quad \text{Equation 1-4}$$

wherein P and v indicate the atmospheric pressure (760 Torr) and a volume of the additional gas supply line 208, respectively. Moreover, $\alpha$, $\beta$ and $\gamma$ represent parameters determined by a configuration of the substrate processing apparatus 100. To be specific, $\alpha$, $\beta$ and $\gamma$ represent device dependent parameters relating to a pressure ratio of the first and the second processing gas, a line volume and an offset, respectively. Although $\alpha$ and $\beta$ may be expressed as a single parameter, the apparatus can be more precisely controlled by setting $\alpha$ and $\beta$ separately.

By using Equation 1-4, the initial flow rate Fa can be determined to be a maximum flow rate required for an inner pressure of the additional gas supply line to reach the inner pressure Pe of the second branch line at a lapse of the initial time (specific time) T. In other words, it is possible to determine the optimal initial flow rate Fa at which the inner pressure of the additional gas supply line 208 can be increased to the inner pressure Pe of the second branch line in a short period of time (herein, one second), thereby shortening time required from the initiation of the supply of the additional gas from the additional gas supply line 208 to the accomplishment of the stable pressure thereof supplied to the processing chamber 110 via the second branch line.

Such determined initial flow rate Fa of the additional gas is stored specifically in a storage area for the initial flow rate Fa in the gas supply process data 352. After the initial flow rate Fa of the additional gas is obtained, the initial flow rate determining process is completed. Then, the wafer is processed by actually supplying the gases to the processing chamber 110.

Figure 11:
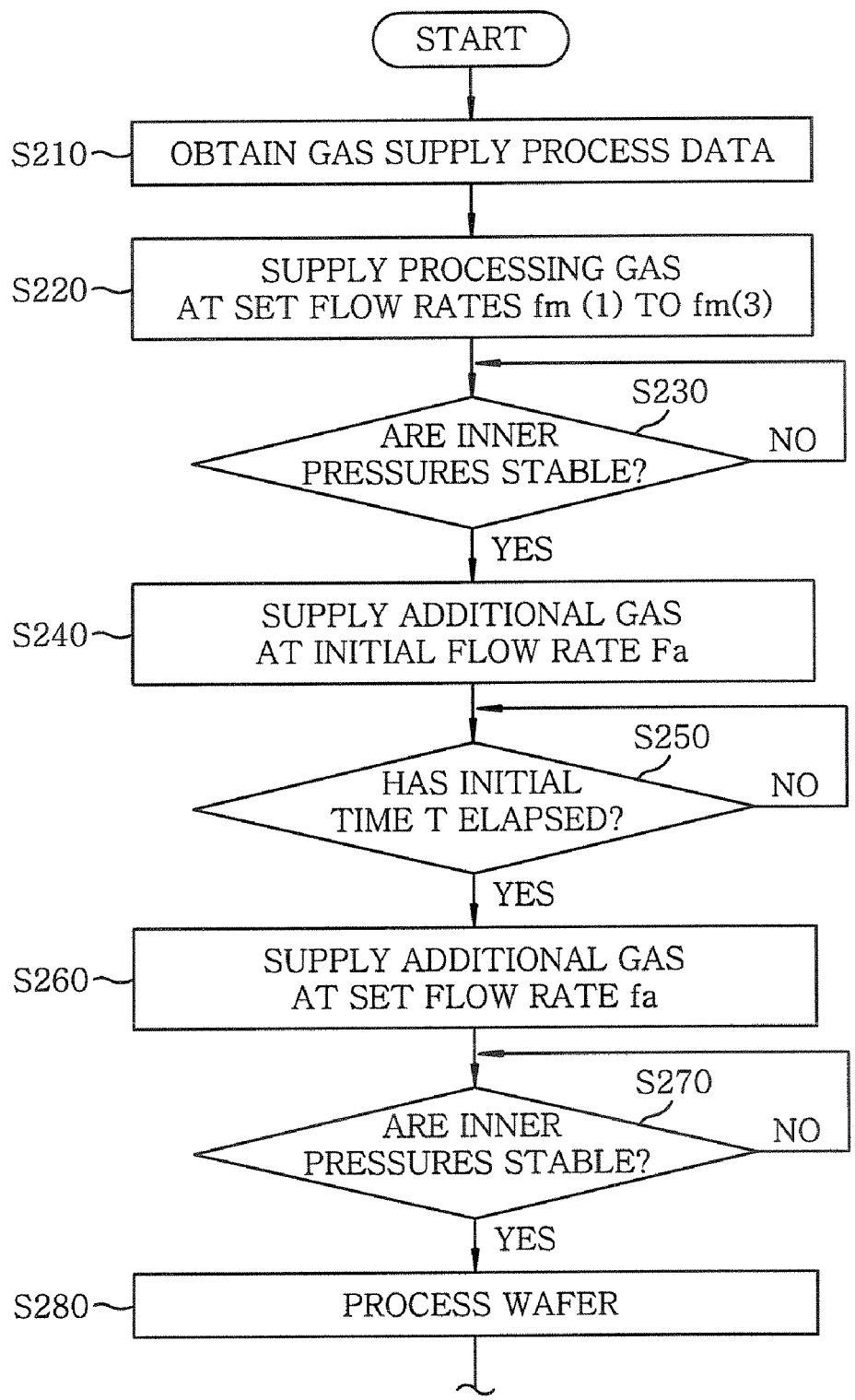
FIG. 11 illustrates a flowchart of a specific example of processes to be executed after the initial flow rate determining process.

A specific example of processes performed after the initial flow rate determining process is described in FIG. 11. As can be seen from FIG. 11, data (the processing gas data and the additional gas data) necessary for the processes are obtained in a step S210 from the gas supply process data 352.

Next, the processing gas supply process (processing gas supply control) is initiated in a step S220 by the processing gas supply unit 210. To be specific, the processing gas is supplied from the processing gas lines 1 to 3 of the processing gas supply unit 210 at the respective set flow rates fm(1) to fm(3) To be specific, the $C_XF_Y$ gas, the $O_2$ gas and the Ar gas, for example, from the gas supply sources 212a to 212c are supplied at respective set flow rates fm(1) to fm(3) and then mixed at a preset mixing ratio. Thus generated gaseous mixture flows as a processing gas along the processing gas supply line 202.

At this time, the controller 300 controls the branch flow control unit 230 to control branch flows of the processing gas by regulating a pressure ratio. To be specific, when the controller 300 issues instructions for a pressure ratio control, the branch flow control unit 230 adjusts, based on the pressures detected by the pressure sensors 232a and 234a, respective opening degrees of the valves 232b and 234b by controlling the pressure controller 240, thereby regulating to be kept at a target pressure ratio the pressure ratio between the first and the second branch line 204 and 206. Accordingly, a flow rate ratio between the first and the second processing gas is determined, the first and the second processing gas being supplied to the first and the second chamber 163a and 163b via the first and the second branch line 204 and 206, respectively.

Then, it is checked in a step S230 weather or not the inner pressures of the first and the second branch line 204 and 206 are stable. If it is determined that the inner pressures thereof are stable, the additional gas supply process (additional gas supply control) is initiated in steps S240 to S270.

First of all, an additional gas from an additional gas line of the additional gas supply unit 220 is supplied at an initial flow rate Fa in the step S240. Then, it is checked in the step S250 whether or not an initial time T (one second in this example) has elapsed.

If it is determined in the step S250 that the initial time T has elapsed, the additional gas is supplied at a set flow rate fa in the step S260. In such additional gas supply process, the additional gas supplied from the additional gas supply unit 220 to the second branch line 206 via the additional gas supply line 208 reaches the processing chamber 110 in a short period of time, and is then supplied at the set flow rate fa, together with the second processing gas, to the processing chamber 110.

In this manner, a $C_XF_Y$ gas (e.g., $CF_4$ gas) capable of facilitating the etching is supplied at a specific flow rate from the additional gas supply unit 220a to the second buffer chamber 163b via the second branch line 206. Accordingly, the second buffer chamber 163b is supplied with the processing gas containing a large amount of $CF_4$ gas compared with that contained in processing gas supplied to the first buffer chamber 163a. In this way, the gas components and the flow rate of the processing gas to be supplied to the second buffer chamber 163b are determined.

Thereafter, in a step S270, it is determined whether the inner pressures of the first and the second branch line 204 and 206 are stable or not. If it is determined in the step S270 that the respective inner pressures thereof are stable, the wafer is processed in a step S280. By performing the aforementioned gas supply process, in the substrate processing apparatus 100, the gaseous mixture is supplied from the first buffer chamber 163a to a vicinity of the central region of the wafer W on the susceptor 116 under the depressurized atmosphere and, also, the gaseous mixture containing a large amount of $CF_4$ gas is supplied from the second buffer chamber 163b to the peripheral region (edge portion) of the wafer W. Accordingly, etching characteristics on the peripheral region of the wafer W are controlled to be comparatively adjusted with respect to those on the central region of the wafer W, which results in an in-surface uniformity of etching the wafer W.

Referring to the processes shown in FIG. 11, the processing gas from the processing gas supply unit 210 is distributed into the first and the second branch line 204 and 206. The processing gas distributed into the first branch line 204 is supplied to the processing chamber 110 as it is supplied from the processing gas supply unit 210, whereas the processing gas distributed into the second branch line 206 is added thereto with the additional gas and then supplied to the processing chamber 110 with adjusted gas components and flow rates. Accordingly, the processing gas having components common to the branch lines 204 and 206 can be supplied from the processing gas supply unit 210 to each of the branch lines 204 and 206 and, also, the gas components or the ratio of the flow rates of the processing gas flowing in the second branch line 206 can be adjusted by adding thereto the additional gas on demand.

Therefore, when the processing gas distributed into the branch lines has a large number of common components, the number of lines is reduced compared with a case where each of the gas supply sources has its own branch line. By minimizing the number of lines of the gas supply system 200, the gas supply system 200 can be configured with a simple line configuration. Further, since the branch flows of the processing gas are controlled based on the respective inner pressures of the branch lines 204 and 206, the gas can be supplied from plural portions in the processing chamber 110 with a simple control operation.

The additional gas is supplied at the initial flow rate Fa greater than the set flow rate fa for the initial time T (e.g., one second) and then supplied at the set flow rate fa afterward. Accordingly, the inner pressure of the additional gas supply line 208 increases faster compared with a case where the additional gas is supplied from the beginning at the set flow rate fa of a very small amount. Therefore, it is easier for the additional gas to flow toward the second branch line 206, which shortens time required from the initiation of the supply of the additional gas to the accomplishment of a stable pressure (gas concentration) thereof supplied to the processing chamber 110 (additional gas supply time). Moreover, since the initial flow rate Fa of the additional gas is an optimal value determined based on the volume and the inner pressure of the additional gas supply line 208, the additional gas supply process can be performed at the optimal initial flow rate Fa in the substrate processing apparatus. Consequently, the initial flow rate Fa of the additional gas can be optimized depending on the substrate processing apparatus to minimize the additional gas supply time.

Figure 12:
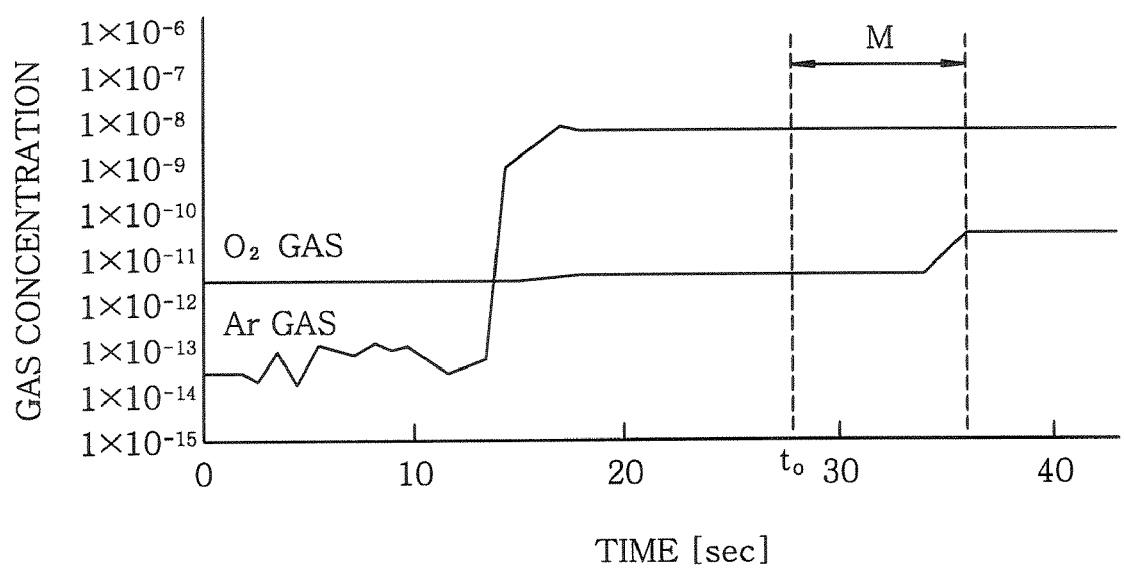
FIG. 12 is a graph showing a result of an experiment of supplying an additional gas by the additional gas supply process in accordance with the embodiment of the present invention.

Hereinafter, a result of an experiment of supplying an additional gas by the aforementioned additional gas supply process will be described with reference to FIG. 12. In this experiment, Ar gas and $O_2$ gas were respectively supplied from the processing gas supply unit 210 and the additional gas supply unit 220 and, then, states of the gases supplied to the processing chamber 110 were checked. To be specific, Ar gas was supplied at a set flow rate of 1100 sccm. Further, $O_2$ gas was supplied at an optimal initial flow rate of 49.9 sccm from the time to for a period of time, e.g., one second, and then at a set flow rate of 7 sccm. FIG. 12 provides a graph showing a result of detecting concentrations of Ar gas and $O_2$ gas by using the gas concentration measuring device attached to the gas inlet port of the processing chamber 110. A horizontal and a vertical axis in FIG. 12 represent the time and the gas concentration, respectively. As can be seen therefrom, the concentrations of Ar gas and $O_2$ gas vary depending on flow rates of Ar gas and $O_2$ gas supplied to the gas inlet port of the processing chamber 110, so that a flow rate variation of Ar gas and $O_2$ gas supplied to the processing chamber 110 can be estimated from the gas concentration variation.

Referring to the experimental data shown in FIG. 12, the concentration of $O_2$ gas is stable after a time period M has elapsed from the initiation time to of the $O_2$ gas supply. The time period M corresponding to the additional gas supply time was 4.5 second. On the other hand, when $O_2$ gas was supplied at the set flow rate from the beginning, tens of seconds were detected as the additional gas supply time. Therefore, the additional gas supply time can be greatly shortened by performing the additional gas supply process of the present invention.

The controller 300 may control, before supplying the additional gas, the branch flow control unit 230 to control branch flows of the processing gas by fixedly maintaining the pressure thereof. To be specific, when the controller 300 issues instructions for a fixed pressure control, the branch flow control unit 230 adjusts, based on the pressures detected by the pressure sensors 232a and 234a, respective opening degrees of the valves 232b and 234b by controlling the pressure controller 240, thereby fixedly maintaining the inner pressure of the first branch line 204.

In this way, even if the inner pressure of the second branch line 206 is changed due to the supply of the additional gas thereto, the processing gas required to flow toward the second branch line 206 can be prevented from flowing toward the first branch line 204. Accordingly, the ratio of the flow rates (distribution amounts) of the processing gas flowing toward the first and the second branch line 204 and 206 can be prevented from being changed by supplying the additional gas, and thus the processing gas can be supplied to different areas on a surface of a wafer at respective desired flow rates. Consequently, a desired in-surface uniformity can be achieved.

(Additional Gas Supply Process Performed in Consideration of Maximum Allowable Flow Rate of Additional Gas Line)

The following is a description of an additional gas supply process performed in consideration of a maximum allowable flow rate of the additional gas line of the additional gas supply unit 220. In the initial flow rate determining process of the additional gas in FIG. 10, the initial flow rate Fa is determined while fixing the initial time T to a period of time (e.g., one second), so that the initial flow rate Fa may exceed a maximum allowable flow rate fmax. In such a case, the additional gas is not allowed to be supplied at the initial flow rate Fa.

Therefore, it is preferable to lengthen the initial time T while setting the maximum allowable flow rate fmax as the initial flow rate Fa. Accordingly, the additional gas can be supplied for the compensated initial time T at the initial flow rate Fa corresponding to the maximum allowable flow rate fmax, which enables the additional gas supply process to be optimally performed within the maximum allowable flow rate fmax. Hence, the additional gas supply process can be performed for the optimal initial time T in accordance with a configuration of the substrate processing apparatus.

Figure 13:
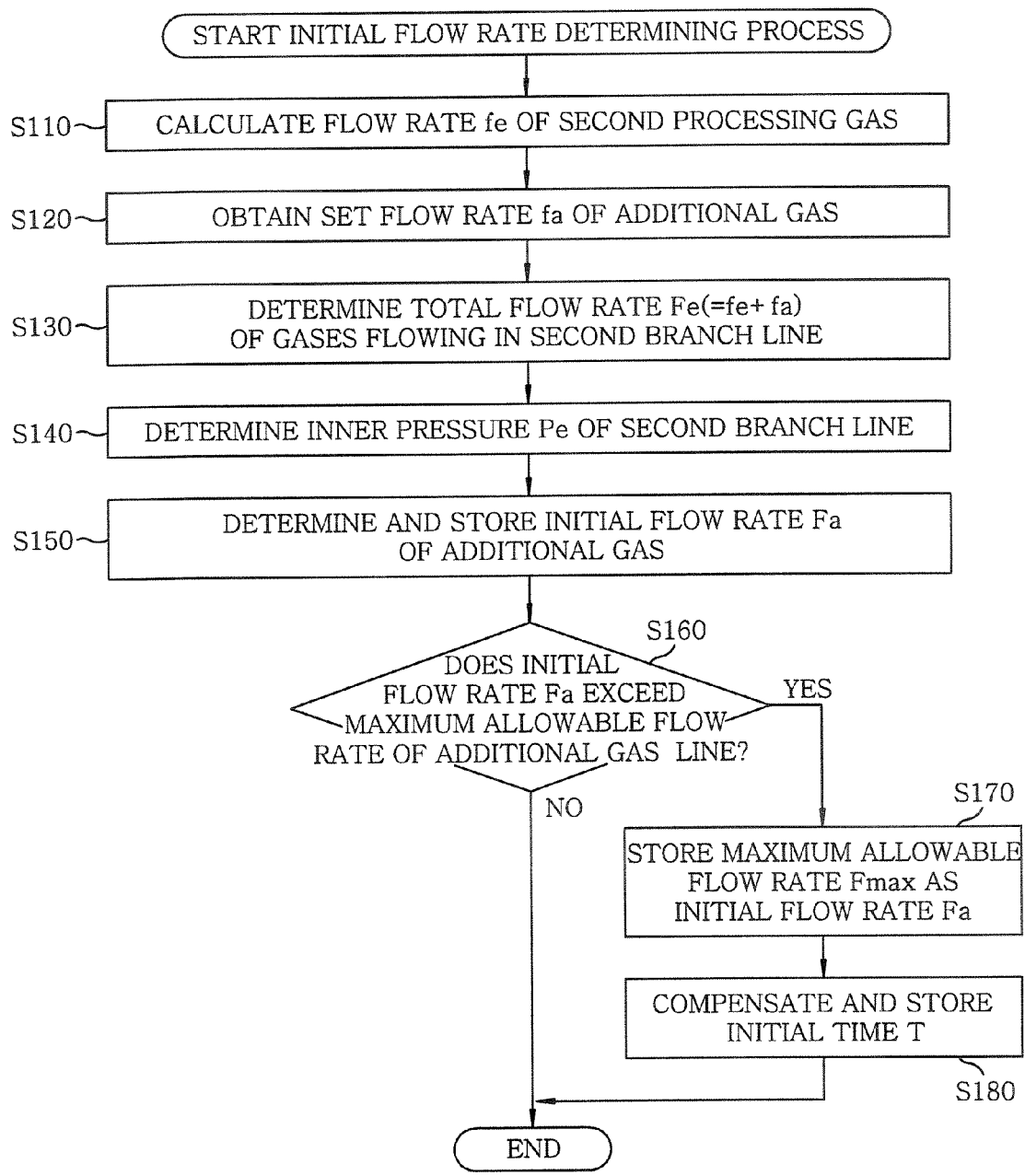
FIG. 13 presents a flowchart of a specific example of an initial flow rate determining process performed while considering a maximum allowable flow rate of an additional gas line.

Hereinafter, a specific example of the initial flow rate determining process performed in consideration of the maximum allowable flow rate fmax of the additional gas line will be described with reference to FIG. 13. Steps S110 to S150 of the initial flow rate determining process described in FIG. 13 are the same as those depicted in FIG. 10.

In a step S160, it is checked whether or not the determined initial flow rate Fa exceeds the maximum allowable flow rate fmax of the additional gas line. If it is determined that the initial flow rate Fa does not exceed the maximum allowable flow rate fmax of the additional gas line, a series of the initial flow rate determining process is completed. On the contrary, if it is determined that the initial flow rate Fa exceeds the maximum allowable flow rate fmax of the additional gas line, the initial flow rate Fa is reset in a step S170 and the initial time T is then compensated in a step S180.

To be specific, the maximum allowable flow rate fmax of the additional gas line is set and stored as the initial flow rate Fa in the data table of the gas supply process data 352 in the step 170. Next, the initial time T is compensated and stored in the step S180. In other words, in a state where the initial flow rate Fa is fixed to the maximum allowable flow rate fmax of the additional gas line, the initial time T is determined by using Equation 1-5 which is derived from Equation 1-4:

$$T = \alpha \cdot (Pe/P) \cdot \beta \cdot 60 \cdot v/Fa + \gamma.$$ Equation 1-5

By using the Equation 1-5, the initial time T can be determined to be time required for an inner pressure of the additional gas supply line 208 to reach that of the second branch line 206 in supplying the additional gas at the initial flow rate Fa corresponding to the maximum allowable flow rate fmax. Accordingly, the initial processing can be performed for the optimal initial time T in accordance with a configuration of the substrate processing apparatus, which enables the additional gas supply control to be optimally performed within the maximum allowable flow rate fmax of the additional gas line. In this case, although the initial time T is lengthened because the initial flow rate after a compensation thereof is set to be a maximum allowable flow rate smaller than the initial flow rate before the compensation, the additional gas supply time can be shortened compared with a case where the additional gas is supplied at the set flow rate from the beginning. After the compensated initial time T is stored in the data table of the gas supply process data 352, a series of the initial flow rate determining process is completed.

(Another Specific Configuration Example of Gas Supply System)

Figure 14:
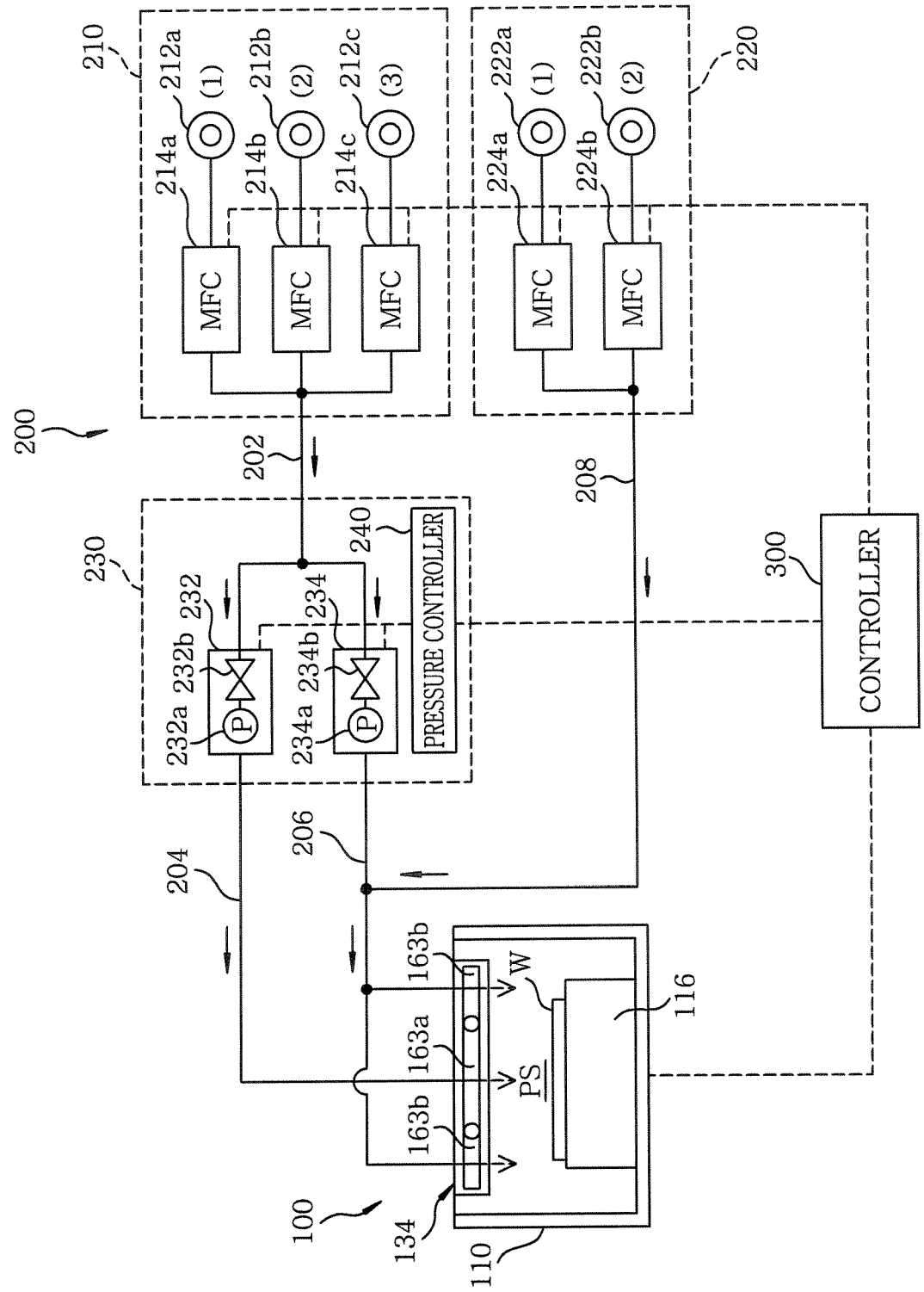
FIG. 14 provides a block diagram of another configuration example of the gas supply system in accordance with the embodiment of the present invention.

The following is a description on a specific configuration example of each unit of the gas supply system 200. FIG. 14 is a block diagram showing another specific configuration example of the gas supply system 200. Hereinafter, there will be described a case where the additional gas supply unit has a plurality of additional gas lines.

As shown in FIG. 14, the additional gas supply unit 220 includes a gas box accommodating therein a plurality of (e.g., two) additional gas lines 1 and 2. At respective upstream sides of the additional gas lines 1 and 2, gas supply sources 222a and 222b are provided, respectively. Further, downstream sides of the additional gas lines 1 and 2 are joined to be connected with the additional gas supply line 208. Provided on the additional gas lines 1 and 2 are mass flow controllers 224a and 224b for adjusting respective flow rates of the gases from the gas supply sources 222a and 222b. The gases from the gas supply sources 222a and 222b of the additional gas supply unit 220 are mixed at a preset flow rate ratio. Next, the mixed gas flows along the additional gas supply line 208 and then is supplied to the second branch line 206 at a downstream side of the branch flow control unit 230.

The gas supply source 222a airtightly seals therein a $C_XF_Y$ gas capable of facilitating an etching, for example. The gas supply source 222b airtightly seals therein an $O_2$ gas capable of controlling a deposition of CF-based reaction products, for example. The number of gas supply sources of the additional gas supply unit 220 may be more than three without being limited to the example shown in FIG. 14.

In case the additional gas supply unit has plural additional gas lines, an initial flow rate in each of the additional gas lines needs to be determined in the additional gas supply process. The gas supply process data 352 for performing the additional gas supply process has the data table shown in FIG. 15, for example. The data table at least stores therein processing gas data and additional gas data.

Since the processing gas data in the data table of FIG. 15 is the same as that of FIG. 9, a detailed description thereof will be omitted. Installed in the data table of FIG. 15 is a storage area for storing therein, as the additional gas data, set flow rates fa(1) and fa(2) of the additional gas lines 1 and 2, a total set flow rate fa (=fa(1)+fa(2)) of the additional gases, initial flow rates Fa1 and Fa2 of the additional gas lines 1 and 2, a total initial flow rate Fa (=Fa(1)+Fa(2)) and an initial time T for allowing the additional gases to be supplied at the initial flow rates Fa(1) and Fa(2).

In the gas supply process data 352, the processing gas data and the set flow rates of the additional gases in the additional gas data may be preset by an operator's manipulating the manipulation unit 340. The initial flow rates Fa(1) and Fa(2) of the additional gases and the total initial flow rate Fa are determined by an initial flow rate determining process to be described later with reference to FIG. 16. Although the initial time T is preset as a default value (e.g., one second), it can be changed by an operator's manipulating the manipulation unit 340.

(Initial Flow Rate Determining Process of Additional Gases)

Figure 16:
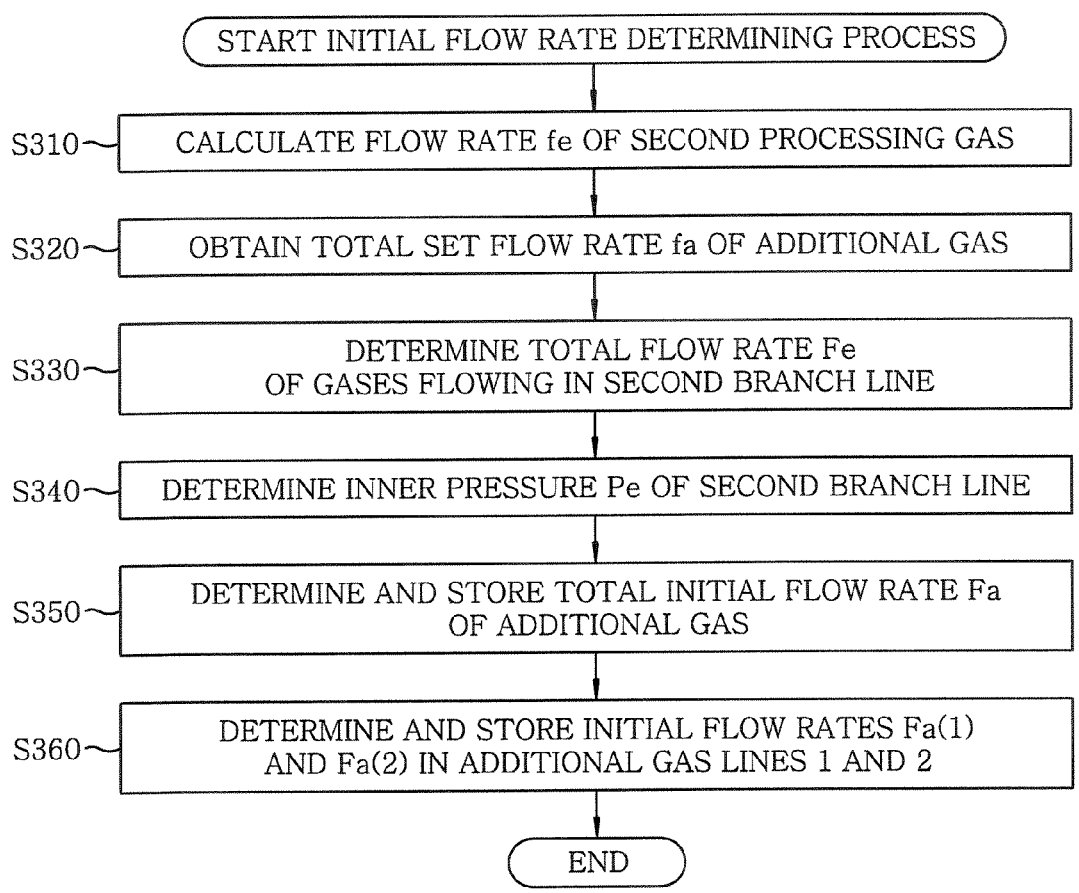
FIG. 16 represents a flowchart of another specific example of the initial flow rate determining process in accordance with the embodiment of the present invention.

The controller 300 performs an initial flow rate determining process of additional gases based on the gas supply process data 352, the initial flow rate determining process being similar to that shown in FIG. 16. As shown in FIG. 16, the controller 300 determines, in a step S310, a flow rate fe of the second processing gas based on a total set flow rate fm of the processing gas and a flow rate ratio C:E between the first and the second processing gas, both being obtained from the gas supply process data 352. The flow rate fe of the second processing gas is calculated as in the step S110.

A total set flow rate fa in the additional gas lines is obtained in a step S320 from the gas supply process data 352. Then, a total flow rate Fe of the gases flowing in the second branch line (i.e., Fe=the flow rate fe of the second processing gas+the total set flow rate fa of the additional gases) is determined in a step S330.

In a step S340, an inner pressure Pe of the second branch line 206 is determined based on the total flow rate Fe. The inner pressure Pe thereof is determined as in the step S140. In a step S350, a total initial flow rate Fa of the additional gas lines is determined and stored. The total initial flow rate Fa is determined as in the step S150.

Thereafter, initial flow rates Fa(1) and Fa(2) in the additional gas lines 1 and 2 are determined and stored in a step S360. The initial flow rates Fa(1) and Fa(2) are determined such that a ratio therebetween is the same as that between the set flow rates fa(1) and fa(2) of the additional gas lines 1 and 2. To be specific, it is determined by using Equation 1-6:

$$Fa(x)=Fa\cdot(f(x)/fa), \quad \text{Equation 1-6}$$

wherein x indicates a numerical order of the additional gas lines. For example, x is 1 in the additional gas line 1 and 2 in the additional gas line 2. Moreover, fa and Fa respectively represent the total set flow rate and the total initial flow rate. When the set flow rates in the additional gas lines fa(1) and fa(2) are respectively 10 sccm and 20 sccm, the total set flow rate fa is 30 sccm. Thus, when the total initial flow rate Fa is determined to be 60 sccm, the initial flow rates in the additional gas lines Fa(1) and Fa(2) are respectively determined to be 20 sccm and 40 sccm.

After the initial flow rates in the additional gas lines are determined, a series of the initial flow rate determining process is completed. Hence, optimal values of the initial flow rates can be determined by using a ratio between the set flow rates in the additional gas lines.

(Additional Gas Supply Process Performed in Consideration of Maximum Allowable Flow Rates in Additional Gas Lines)

The following is a description of an additional gas supply process performed in consideration of maximum allowable flow rates in the additional gas lines of the additional gas supply unit 220. In the initial flow rate determining process of FIG. 16, the initial flow rates Fa(1) and Fa(2) in the additional gas lines are determined while fixing the initial time T for supplying the additional gases to a period of time (e.g., one second), so that an initial flow rate in any additional gas line may exceed a maximum allowable flow rate therein. In such a case, the additional gases are not allowed to be supplied at such initial flow rates. For example, even if the initial flow rate Fa(1) does not exceed a maximum allowable flow rate fmax(1), the initial flow rate Fa(2) may exceed a maximum allowable flow rate fmax(2).

In that case, the initial flow rate Fa(1) is compensated while setting the initial flow rate Fa(2) to the maximum allowable flow rate fmax(2) and, also, the initial time T is compensated based on the maximum allowable flow rate fmax(2). Accordingly, the additional gases are supplied at the compensated initial flow rates Fa(1) and Fa(2) for the compensated initial time T, which enables an additional gas supply process to be optimally performed while preventing an initial flow rate in any additional gas line from exceeding a maximum allowable flow rate therein. In this manner, the additional gas supply process can be performed for the optimal initial time T in accordance with a configuration of the substrate processing apparatus. As a result, it is possible to minimize the additional gas supply time depending on substrate processing apparatus employed.

Figure 17:
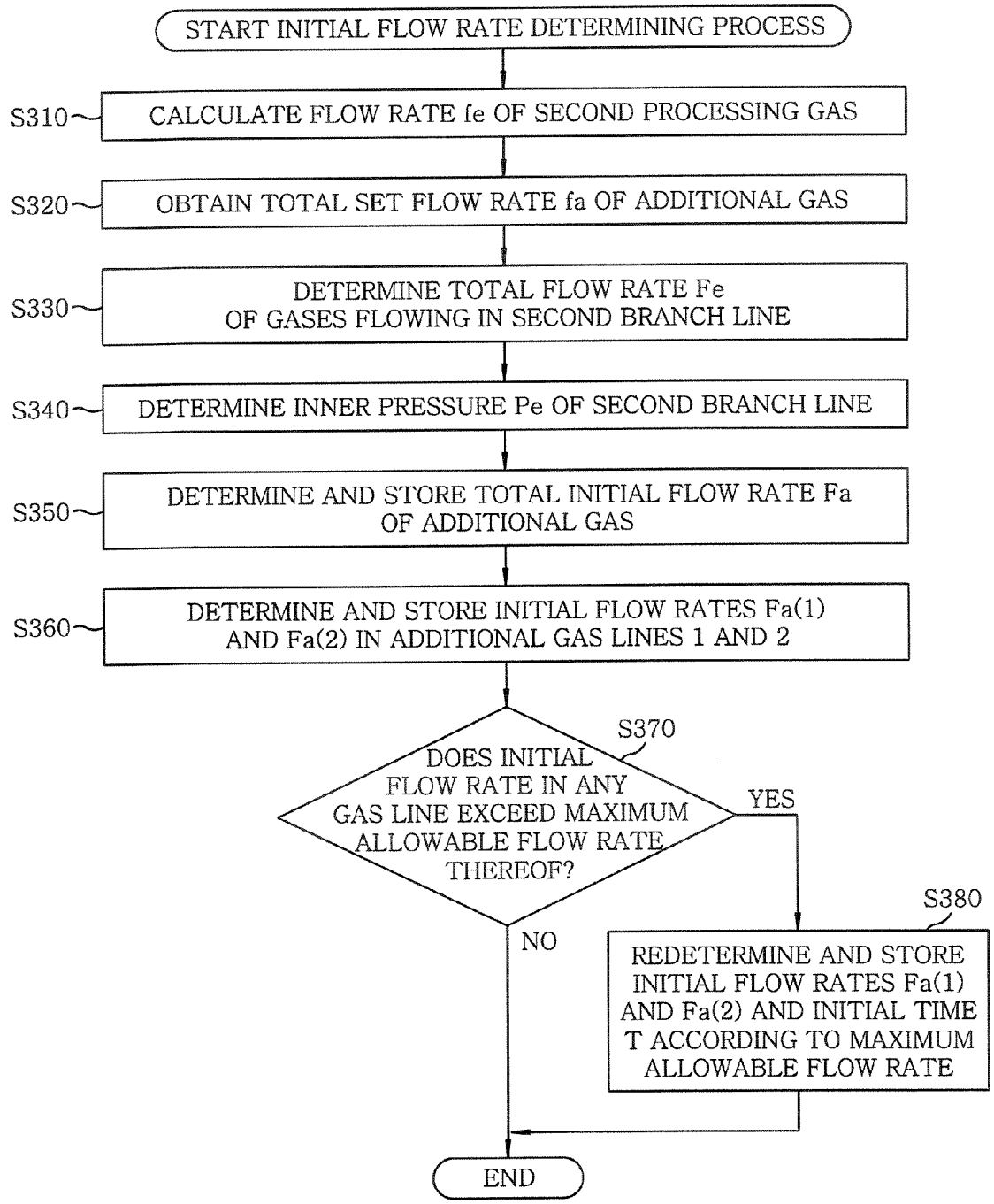
FIG. 17 offers a flowchart of another specific example of the initial flow rate determining process performed while considering the maximum allowable flow rate of the additional gas line.

Hereinafter, a specific example of the initial flow rate determining process performed in consideration of the maximum allowable flow rates in the additional gas lines will be described with reference to FIG. 17. The steps S310 to S360 of the initial flow rate determining process described in FIG. 17 are the same as those illustrated in FIG. 16.

In a step S370, it is checked whether or not the determined initial flow rates Fa(1) and Fa(2) in the additional gas lines 1 and 2 exceed the maximum allowable flow rates fmax(1) and fmax(2) in the additional gas lines, respectively. If it is determined that the initial flow rate Fa(1) and the initial flow rate Fa(2) do not exceed the maximum allowable flow rate fmax(1) and fmax(2), respectively, in the additional gas lines, a series of the initial flow rate determining process is completed. On the contrary, if it is determined that either the initial flow rate Fa(1) or the initial flow rate Fa(2) exceeds the maximum allowable flow rate fmax(1) or fmax(2), respectively, in the additional gas lines, the initial flow rates Fa(1) and Fa(2) and the initial time T are compensated in a step S380.

To be specific, the initial flow rates Fa(1) and Fa(2) and the initial time T are redetermined, based on either the maximum allowable flow rate fmax(1) or fmax(2) exceeded by the initial flow rate Fa(1) or Fa(2), and stored in a step S380. As described in the aforementioned example, when the set flow rates fa(1) and fa(2) in the additional gas lines are respectively 10 sccm and 20 sccm, if the total initial flow rate Fa is determined to be 60 sccm, the initial flow rates Fa(1) and Fa(2) in the additional gas lines are respectively determined to be 20 sccm and 40 sccm. In such a case, if the maximum allowable flow rate fmax(2) in the additional gas line 2 is 30 sccm, the additional gas is not allowed to be supplied at the initial flow rate Fa(2) of 40 sccm and, thus, the initial flow rate Fa(2) is set to be the maximum allowable flow rate fmax(2), i.e., 30 sccm. Accordingly, the initial flow rate Fa(1) is compensated such that an initial flow rate ratio becomes the same as the set flow rate ratio and thus becomes 15 sccm. As a result, the total initial flow rate Fa becomes 45 sccm (=30 sccm+15 sccm) By applying such values to Equation 1-5, the initial time T can be determined.

After the compensated initial flow rates Fa(1) and Fa(2), total initial flow rate Fa and initial time T are stored in the data table of the gas supply process data 352, a series of the initial flow rate determining process is completed. Although the initial flow rates of the two additional gas lines 1 and 2 are determined in the initial flow rate determining processes of FIGS. 16 and 17, initial flow rates can be determined on the basis of the number of additional gas lines of the additional gas supply unit 220.

In the initial flow rate determining processes described in the aforementioned embodiments (see FIGS. 10, 13, 16 and 17), if a wafer is processed in plural steps and an additional gas has different set flow rates in each of the steps, it is preferable to determine initial flow rates of the additional gas in each of the steps. Hence, the additional gas supply process can be performed according to the steps of the wafer processing.

The second branch line 206 of the aforementioned embodiment may be configured as a plurality of branch lines branched from the processing gas supply line 202 so that the additional gas from the additional gas supply unit 220 can be respectively supplied to the second branch lines. In such a case, the processing gas can be supplied separately to plural portions of the peripheral region of the wafer, so that it is possible to more precisely control the uniformity of processing the peripheral region of the wafer.

Although the aforementioned embodiment describes a case where the processing gas supplied from the gas supply system 200 is injected from an upper portion of the processing chamber 110 toward the wafer W, there may be provided, without being limited thereto, another case where the processing gas is injected from, e.g., a side surface of a plasma generation space PS in the processing chamber 110, other portions of the processing chamber 110. In such a case, since specific processing gas can be supplied from an upper portion and a side portion of the plasma generation space PS, it is possible to control a gas concentration in the plasma generation space PS, which leads to an improved in-surface uniformity in processing the wafer.

The aforementioned embodiment describes a case in which pressure control units control branch flows of the processing gas flowing toward the branch lines. However, there may be provided, without being limited thereto, another case in which mass flow controllers control the branch flows of the processing gas flowing toward the branch lines. Further, although the present invention is applied to a plasma etching apparatus as a substrate processing apparatus in the aforementioned embodiment, the present invention may be applied to another substrate processing apparatus where a processing gas is supplied, e.g., a film forming apparatus such as a plasma CVD apparatus, a sputtering apparatus, a thermal oxidation apparatus or the like. Moreover, the present invention may be applied to a MEMS (micro electro mechanical system) manufacturing apparatus or another substrate processing apparatus for processing as a target substrate an FPD (flat-panel display), a photomask reticle or the like, other than a wafer.

The present invention may be applied to a gas supply system for supplying processing gas to a processing chamber, a substrate processing apparatus and a gas supply method.

As described above, the present invention can provide a gas supply system and the like, capable of achieving a desired in-surface uniformity with a simple line configuration and shortening time required for supplying an additional gas by a simple control.

While the invention has been shown and described with respect to the preferred embodiments, it will be understood by those skilled in the art that various changes and modification may be made without departing from the scope of the invention as defined in the following claims.

What is claimed is:

1. A gas supply system for supplying a gas into a processing chamber for processing a substrate to be processed, the system comprising:
 a processing gas supply unit for supplying a processing gas for processing the substrate to be processed;
 a processing gas supply line for allowing the processing gas from the processing gas supply unit to flow therein;
 a first and a second branch line branched from the processing gas supply line to be connected with different portions of the processing chamber;
 a branch flow control unit for controlling branch flows of the processing gas distributed from the processing gas supply line to the first and the second branch line based on inner pressures of the first and the second branch line, respectively;
 an additional gas supply unit for supplying an additional gas;
 an additional gas supply line, joining the second branch line at a downstream side of the branch flow control unit, for allowing the additional gas from the additional gas supply unit to flow therein;
 a storage unit which stores a value of a fixed period of time; and
 a control unit which controls, before processing said substrate to supply the additional gas at an initial flow rate greater than a set flow rate and then at the set flow rate after a lapse of the fixed period of time stored in the storage unit,
 wherein the branch flow control unit is configured to maintain the inner pressure of the first branch line constant, before and after the additional gas is supplied to the second branch line,
 wherein the control unit determines an inner pressure of the second branch line and determines the initial flow rate based on a volume of the additional gas supply line in which the additional gas flows and the inner pressure of the second branch line into which the additional gas from the additional gas supply line flows, and
 wherein the control unit determines an inner pressure of the second branch line and determines the initial flow rate to be a maximum flow rate required for an inner pressure of the additional gas supply line to reach the inner pressure of the second branch line at the lapse of the fixed period of time.

2. The gas supply system of claim 1, wherein the additional gas supply unit includes an additional gas line connected with an additional gas supply source, and wherein the control unit sets, if the initial flow rate exceeds a maximum allowable flow rate in the additional gas line, the maximum allowable flow rate as the initial flow rate and lengthens the period of time to compensate for the reduction of the initial flow rate.

3. The gas supply system of claim 1,
 wherein the control unit determines the fixed period of time to be a time required for the inner pressure of the additional gas supply line to reach the inner pressure of the second branch line when supplying the additional gas at a maximum allowable flow rate set as the initial flow rate.

4. The gas supply system of claim 1,
 wherein a volume of the additional gas supply line is smaller than that of the second branch line.

5. A substrate processing apparatus comprising:
 a processing chamber for processing a substrate to be processed;
 a gas supply system for supplying a gas into the processing chamber; and
 a control unit for controlling the gas supply system,
 wherein the gas supply system includes:
 a processing gas supply unit for supplying a processing gas for processing the substrate to be processed;
 a processing gas supply line for allowing the processing gas from the processing gas supply unit to flow therein;
 a first and a second branch line branched from the processing gas supply line to be connected with different portions of the processing chamber;
 a branch flow control unit for controlling branch flows of the processing gas distributed from the processing gas supply line to the first and the second branch line based on inner pressures of the first and the second branch line, respectively;
 an additional gas supply unit for supplying an additional gas; and
 an additional gas supply line, joining the second branch line at a downstream side of the branch flow control unit, for allowing the additional gas from the additional gas supply unit to flow therein, and
 a storage unit which stores a value of a fixed period of time,
 wherein the control unit controls, before processing the substrate, the additional gas supply unit to supply the additional gas at an initial flow rate greater than a set flow rate and then at the set flow rate after a lapse of the fixed period of time stored in the storage unit,
 wherein the branch flow control unit maintains the inner pressure of the first branch line constant, before and after the additional gas is supplied to the second branch line,
 wherein the control unit determines an inner pressure of the second branch line and determines the initial flow rate is based on a volume of the additional gas supply line in which the additional gas flows and the inner pressure of the second branch line into which the additional gas from the additional gas supply line flows, and
 wherein the control unit determines the initial flow rate to be a maximum flow rate required for an inner pressure of the additional gas supply line to reach the inner pressure of the second branch line at the lapse of the fixed period of time.

* * * * *